United States Patent
Park et al.

(10) Patent No.: US 6,534,813 B1
(45) Date of Patent: Mar. 18, 2003

(54) SEMICONDUCTOR DEVICE HAVING A SELF-ALIGNED CONTACT STRUCTURE AND METHODS OF FORMING THE SAME

(75) Inventors: Byung-Jun Park, Kyunggi-do (KR); Yoo-Sang Hwang, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/889,588

(22) PCT Filed: Dec. 8, 2000

(86) PCT No.: PCT/KR00/01422

§ 371 (c)(1), (2), (4) Date: Aug. 2, 2001

(87) PCT Pub. No.: WO01/43176

PCT Pub. Date: Jun. 14, 2001

(30) Foreign Application Priority Data

| Dec. 8, 1999 | (KR) | ................................. 1999-55862 |
| Jan. 24, 2000 | (KR) | ................................. 2000-3249 |
| Jul. 26, 2000 | (KR) | ................................. 2000-43125 |

(51) Int. Cl.$^7$ .............................. H01L 27/108
(52) U.S. Cl. ........................ 257/300; 438/396
(58) Field of Search ................ 257/750–761, 257/300; 438/698–700, 694, 702, 704, 706, 717, 381, 253–256, 396–399

(56) References Cited

U.S. PATENT DOCUMENTS 6,372,571 B2 * 4/2002 Kim ............................. 438/239
6,391,771 B1 * 5/2002 Naik et al. ................... 438/653

* cited by examiner

Primary Examiner—David Nelms
Assistant Examiner—David Vu
(74) Attorney, Agent, or Firm—Lee & Sterba, P.C.

(57) ABSTRACT

A self-aligned contact structure in a semiconductor device and methods of forming the same are provided, wherein the self-aligned contact structure in the semiconductor device comprises a semiconductor substrate having active regions; an interlayer insulating layer covering the semiconductor substrate excluding at least a portion of each active region; at least two parallel interconnections on the interlayer insulating layer, at least one active region being relatively disposed between the at least two parallel interconnections, each interconnection having sidewalls, a bottom and a width (x); a mask pattern having a top portion of width (z) and a bottom portion of width (y) formed on each interconnection; and a conductive layer pattern penetrating at least a portion of the interlayer insulating layer between the mask pattern and being electrically connected to at least one active region, wherein $x \leq y \leq z$ and $x < z$.

9 Claims, 17 Drawing Sheets

SEMICONDUCTOR DEVICE HAVING A SELF-ALIGNED CONTACT STRUCTURE AND METHODS OF FORMING THE SAME

TECHNICAL FIELD

The present invention, relates to semiconductor devices and methods of fabricating the same and, more particularly, to self-aligned contact structures in semiconductor devices and methods of forming the same.

BACKGROUND ART

As semiconductor devices become more highly integrated, separation space between interconnection lines decreases. As the separation space between interconnection lines decreases, there is an increase in the probability that misalignments will occur when defining contact holes using photolithography techniques. These contact holes usually penetrate an interlayer insulating layer that exists between interconnection lines that are disposed parallel to each other. A self-aligned contact (SAC) technology recently has been proposed in order to address this misalignment problem.

Conventional SAC technology usually includes forming a plurality of interconnection lines covered with an insulating layer, such as a silicon nitride layer, on a semiconductor substrate. An interlayer insulating layer, such as a silicon oxide layer, typically is then formed over the entire surface of the resultant structure having the plurality of interconnection lines, and thereafter a predetermined region of the interlayer insulating layer that exists between the interconnection lines is etched using the insulating layer formed of the silicon nitride layer as an etching mask. This process forms self-aligned contact holes that expose the semiconductor substrate.

Although though the width of the self-aligned contact holes is wider than the space between the adjacent interconnection lines, this process can prevent the interconnection lines from being exposed by the self-aligned contact holes. This is because the interconnection lines are surrounded by a silicon nitride layer (e.g., insulating layer) having an etching selectivity with respect to the interlayer insulating layer formed of silicon oxide. Accordingly, the misalignment margin is increased during performance of the photolithography process that defines the self-aligned contact holes.

However, the dielectric constant of the silicon nitride layer is higher than that of the silicon oxide layer. Thus, the coupling capacitance, that is, the parasitic capacitance between the interconnection lines and the conductive layer that is used to fill in the self-aligned contact hole, is increased, which in turn degrades the electrical characteristics of the semiconductor device. In addition, in the conventional SAC technology described above, the interconnection lines may be formed of a metal layer, (such as a tungsten layer), or a metal polycidie layer, (such as a tungsten polycide layer), in order to reduce the resistance of the interconnection lines. The metal interconnection lines typically are formed by patterning the metal layer or the metal polycide layer. A bridge may exist, however, between the adjacent interconnection lines during performing the photolithography and etching processes that are used to pattern the metal layer due to the rough surface morphology of the metal layer. Therefore, the adjacent interconnection lines may be electrically connected to each other.

A multi-level interconnection structure fabricated by a dual damascene technology is described in U.S. Pat. No. 5,614,765 entitled "Self-aligned via dual damascene" by Avazino et al., the disclosure of which is incorporated herein by reference in its entirety. According to U.S. Pat. No. 5,614,765, an interlayer insulating layer having a groove and a via hole exposing an underlying interconnection is formed on a substrate, and an upper interconnection is formed to fill the groove and the via hole. Here, the via hole and the groove are formed through one photolithography process.

Forming the groove in accordance with the above-mentioned patent includes forming a photoresist pattern on the interlayer insulating layer, and then etching the interlayer insulating layer to a depth shallower than the thickness of the interlayer insulating layer by using the photoresist pattern as an etching mask. The groove now will include a via portion and a conductive line portion, where the via portion is wider than the conductive line portion. Also, the via hole formation process includes forming a conformal material layer over the entire surface of the resultant structure having the groove. The conformal material layer then is anisotropically etched to form a spacer on a sidewall of the groove, and the interlayer insulating layer is selectively etched in the via portion to expose the underlying interconnection. Here, the conformal material layer should be thinner than half of the width of the via portion, and it should be thicker than half of the width of the conductive line portion. Thus, after forming the spacer, the bottom of the via portion is exposed, and the bottom of the conductive line portion is covered with the spacer.

U.S. Pat. No. 5,614,765 therefore describes the presence of a via hole interposed between the underlying interconnection and the upper interconnection. Notwithstanding such self-alignment techniques, there continues to be a need for improved methods of forming self-aligned contact holes penetrating the interlayer insulating layer between adjacent interconnections.

DISCLOSURE OF INVENTION

It is therefore a feature of an embodiment of the present invention to provide semiconductor devices having self-aligned contact holes. Another feature of an embodiment of the present invention is to provide self-aligned contact structures in semiconductor devices as well as a method of forming self-aligned contact structures that can minimize the parasitic capacitance between a conductive layer pattern filled in the self-aligned contact hole, and the interconnection adjacent to the self-aligned contact hole. It is another feature of an embodiment of the present invention to provide a method of forming a self-aligned contact hole structure that can increase over etching process margins during performance of the etching process that forms the self-aligned contact holes that penetrate the interlayer insulating layer between adjacent interconnections. It is yet another feature of an embodiment of the present invention to provide a method of forming a self-aligned contact hole structure that is capable of easily patterning the interconnections adjacent to the self-aligned contact hole.

In accordance with these and other features of various embodiments of the present invention, there is provided a self-aligned contact structure in a semiconductor device, comprising a semiconductor substrate having active regions, an interlayer insulating layer covering the semiconductor substrate excluding at least a portion of each active region, at least two parallel interconnections on the interlayer insulating layer, at least one active region being relatively disposed between the at least two parallel interconnections, each interconnection having sidewalls, a bottom and a width (x), a mask pattern having a top portion of width (z) and a bottom portion of width (y) formed on each interconnection, and a conductive layer pattern penetrating at least a portion of the interlayer insulating layer between the mask pattern and being electrically connected to at least one active region, wherein $x \leq y \leq z$ and $x<z$. In a preferred embodiment of the present invention, each active region comprises a conductive pad. In another preferred embodiment of the present invention, the second interlayer insulating layer has a dielectric constant that is lower than the dielectric constant of the mask pattern. In another preferred embodiment of the present invention, the interconnections comprise a barrier metal layer and an interconnection metal layer that are sequentially stacked. In another preferred embodiment of the present invention, the interconnections comprise an interconnection metal layer having a bottom and sidewalls and a barrier metal layer surrounding the bottom and sidewalls of the interconnection metal layer. In another preferred embodiment of the present invention, the mask pattern comprises an etch stop layer pattern having sidewalls formed on the interconnection and a first spacer having inner and outer sidewalls formed on the sidewalls of the etch stop layer pattern, the outer sidewall of the first spacer having a vertical profile that is perpendicular to the top surface of the semiconductor substrate. In another preferred embodiment of the present invention, the self-aligned contact structure in a semiconductor device of the present invention further comprises a second spacer interposed between the conductive layer pattern and the first spacer. In another preferred embodiment of the present invention, the mask pattern comprises an etch stop pattern having a vertical sidewall profile that is perpendicular to the top surface of the semiconductor substrate. Preferably, the interlayer insulating layer is made of silicon oxide.

In accordance with a feature of another embodiment of the present invention, there is provided a method of forming a self-aligned contact hole structure in a semiconductor device. In accordance with a feature of a preferred embodiment of the present invention, there is provided a method of forming a self-aligned contact structure in a semiconductor device, comprising providing a semiconductor substrate having active regions, forming an interlayer insulating layer on the semiconductor substrate, forming at least two parallel interconnections on the interlayer insulating layer, at least one active region being disposed between the at least two parallel interconnections, each interconnection having sidewalls, a bottom and a width (x), forming a mask pattern having a top portion (z) and a bottom portion (y) on each interconnection; and forming a conductive layer pattern, penetrating at least a portion of the interlayer insulating layer that is exposed between the mask pattern, that is electrically connected to at least one active region, whereby $x \leq y \leq z$ and $x<z$.

In accordance with a feature of another embodiment of the present invention, the interlayer insulating layer on the semiconductor substrate is a first interlayer insulating layer, and forming the at least two parallel interconnections comprises sequentially forming a first etch stop layer, a second interlayer insulating layer, a second etch stop layer, a third interlayer insulating layer and a third etch stop layer on the first interlayer insulating layer, successively patterning the third etch stop layer, the third interlayer insulating layer and the second etch stop layer to form a first recessed region having at least a sidewall, and a second recessed region having at least a sidewall, each of the first and second recessed regions being substantially parallel to each other, forming a first spacer on the sidewalls of the first and second recessed regions, successively etching the second interlayer insulating layer and the first etch stop layer using the third etch stop layer and the first spacer as etching masks to form a first interconnection groove and a second interconnection groove, and forming a first interconnection and a second interconnection in the first interconnection groove and in the second interconnection groove respectively. The first to third interlayer insulating layers are preferably formed of an insulating layer having an etch selectivity with respect to the first to third etch stop layers and the first spacer. The first to third interlayer insulating layers are preferably formed of an insulating layer having a dielectric constant which is lower than the dielectric constant of the first to third etch stop layers and the first spacer. Forming the mask patterns preferably comprises forming a fourth etch stop layer over the surface of the resultant structure having the first and second interconnections, and filling the first and second recessed regions, and successively blanket-etching the fourth etch stop layer and the third etch stop layer until the third interlayer insulating layer is exposed, thereby forming fourth etch stop layer patterns in the respective first and second recessed regions, wherein the fourth etch stop layer patterns and the first spacer formed on sidewalls thereof constitute the mask pattern. Preferably, the fourth etch stop layer is comprised of the same material layer as the third etch stop layer. Preferably, forming the fourth etch stop layer patterns is followed by removing the exposed third interlayer insulating layer to expose a top surface of the second etch stop layer and a sidewall of the first spacer, forming a second spacer on the sidewall of the first spacer, and etching the second etch stop layer to expose the second interlayer insulating layer.

In another preferred embodiment of the present invention, forming the conductive layer preferably comprises successively anisotropic-etching the third interlayer insulating layer, the second etch stop layer, the second interlayer insulating layer, the first etch stop layer, and the first interlayer insulating layer using the mask patterns as etching masks to thereby form a contact hole exposing the conductive pad, forming a conductive layer over the surface of the resultant structure having the contact hole, filling the contact hole, and patterning the conductive layer. Preferably, the first to third etch stop layers, the fourth etch stop layer patterns, and the spacers are comprised of silicon nitride. Preferably, the third etch stop layer has a thickness greater than the total thickness of the first etch stop layer and the second etch stop layer.

In another preferred embodiment of the present invention, there is provided a method of forming a self-aligned contact structure in a semiconductor device, comprising providing a semiconductor substrate having active regions, forming a first interlayer insulating layer on the semiconductor substrate, forming a second interlayer insulating layer to form at least two parallel grooves on the first interlayer insulating layer, forming an interconnection in a lower portion of each groove, each interconnection having sidewalls, a bottom and a width (x), isotropically etching the second interlayer to increase the width of the exposed portion of each groove, forming a mask pattern having a top portion (z) and a bottom portion (y) in the exposed portion of each groove, and forming a conductive layer pattern, the conductive layer pattern penetrating at least a portion of the first and second interlayer insulating layers between the interconnections formed in the two parallel grooves, and being electrically connected to at least one active region, whereby $x \leq y \leq z$ and $x<z$.

In accordance with yet another preferred embodiment of the present invention, there is provided a method of forming a self-aligned contact structure in a semiconductor device, comprising providing a semiconductor substrate having at least one active region, forming a first interlayer insulating layer on the semiconductor substrate, forming at least two parallel interconnection patterns on the first interlayer insulating layer, at least one conductive pad being disposed between the at least two parallel interconnection patterns, each interconnection pattern having sidewalls, a bottom and width (x), forming a capping layer over the interconnection pattern, forming a second interlayer insulating layer, planarizing the second interlayer insulating layer until the top surface of the interconnection pattern is exposed, and etching the capping layer and the second interlayer insulating layer to form at least one recessed region in the second interlayer insulating layer, the recessed regions having a top portion of width (z) and a bottom portion of width (y) over the interconnection pattern, filling the recessed region with a masking material, forming a conductive layer pattern, the conductive layer pattern penetrating at least a portion of the first and second interlayer insulating layers between the interconnection pattern, and being electrically connected to the at least one active region, whereby $x \leq y \leq z$ and are comprised of a metal layer, bridges are not left between the adjacent interconnections when the method of the invention is carried out.

While the present invention has been described in detail with reference to preferred embodiments, those skilled in the art will appreciate that various modifications may be made to the invention without departing from the spirit and scope thereof.

In accordance with an additional feature of an embodiment of the present invention, there is provided a method of forming a self-aligned contact structure in a semiconductor device. The method includes providing a semiconductor substrate, forming a first interlayer insulating layer, a first etch stop layer, a second interlayer insulating layer, a second etch stop layer, a third interlayer insulating layer and a third etch stop layer on the surface of the resultant structure having the conductive pad The method also includes successively patterning the third etch stop layer, the third interlayer insulating layer and the second etch stop layer to form a first recessed region having at least a sidewall, and a second recessed region having at least a sidewall, whereby each of the first and second recessed regions are substantially parallel to each other.

The method further entails forming spacers on the sidewalls of the respective first and second recessed regions, and successively etching the second interlayer insulating layer and the first etch stop layer using the third etch stop layer and the spacers as etching masks to form first and second interconnection grooves.

A first interconnection and a second interconnection then can be formed in the first interconnection groove, and in the second interconnection groove, respectively. Fourth etch stop layer patterns then can be formed in the respective first and second recessed regions, and the third etch stop layer concurrently removed. The method is completed by successively anisotropic-etching etching the third interlayer insulating layer, the second etch stop layer, the second interlayer insulating layer, the first etch stop layer and the first interlayer insulating layer using the spacers and the fourth etch stop layer patterns as etching masks to thereby form a contact hole exposing the conductive pad.

In accordance with an additional feature of another embodiment of the invention, there is provided a method of forming of forming a self-aligned contact structure in a semiconductor device that includes providing a semiconductor substrate, and forming a conductive pad on the semiconductor substrate. The method also includes sequentially forming a first interlayer insulating layer, a first etch stop layer, a second interlayer insulating layer, a second etch stop layer, a third interlayer insulating layer and a third etch stop layer on the surface of the resultant structure having the conductive pad. The third etch stop layer, the third interlayer insulating layer and the second etch stop layer can be successively patterned to form a first recessed region having at least a sidewall, and a second recessed region having at least a sidewall, whereby each of the first and second recessed regions are substantially parallel to each other.

The method also entails forming first spacers on the sidewalls of the respective recessed regions, and successively etching, the second interlayer insulating layer and the first etch stop layer using the third etch stop layer and the first spacers as etching, masks to form first and second interconnection grooves. A first interconnection and a second interconnection therein can be formed in the first interconnection groove, and in the second interconnection groove, respectively. Fourth etch stop layer patterns then can be formed in the respective first and second recessed regions, and the third etch stop layer concurrently removed. The method further includes removing the third interlayer insulating layer to expose sidewalls of the first spacers, forming second spacers on the exposed sidewalls of the first spacers, and etching the second etch stop layer that is present between the second spacers. The self-aligned contact can be completed by successively anisotropic-etching the second interlayer insulating layer, the first etch stop layer and the first interlayer insulating layer using the fourth etch stop layer patterns, the first spacers and the second spacers as etching masks, to thereby form a contact hole exposing the conductive pad.

BEST MODE FOR CARRYING OUT THE INVENTION

Figure 1:
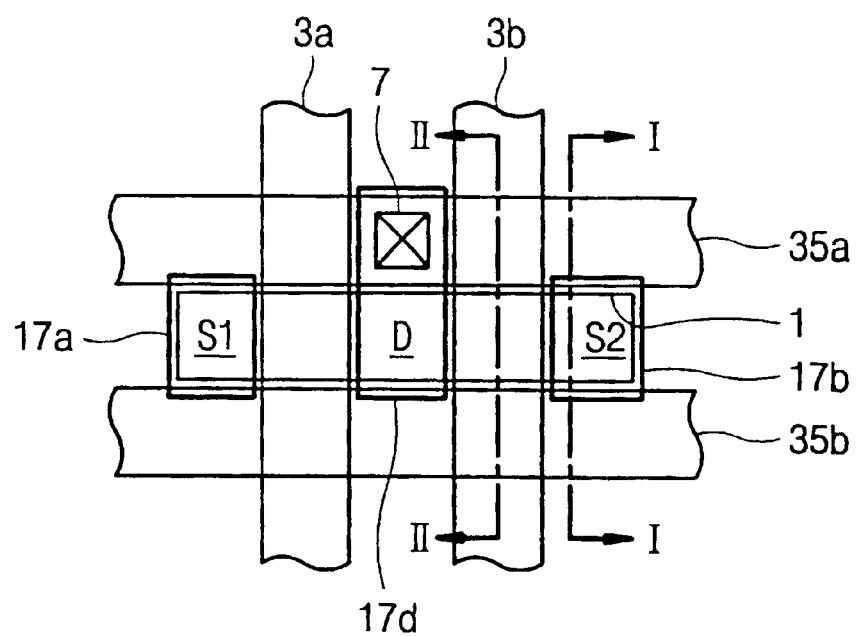
FIG. 1 is a plan view showing a portion of a dynamic random access memory (DRAM) cell array region.

Korean Patent Application Nos. 99-55862, 00-03249 and 00-43125, filed on Dec. 8, 1999, Jan. 24, 2000, and Jul. 26, 2000, respectively, and entitled: "Methods of Forming Self-Aligned Contact Structure in Semiconductor Device"; "Semiconductor Devices Having Contacts Passing Through Between Parallel Conductor Patterns and Methods of Forming the Same"; and "Methods of Forming Semiconductor Devices Having Contacts Passing Through Between Parallel Conductor Patterns", respectively, are incorporated herein by reference in their entirety.

Various preferred embodiments of the invention will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to a, being "on" another layer or substrate, it can be directly on the other layer or substrate, or intervening layers may also be present. Like numbers in the drawings and description refer to like elements throughout this description.

Throughout this description, the expression "substantially parallel" denotes structures that are preferably parallel to one another, although they may be offset from parallel so long as they function in substantially the same manner as a parallel arrangement would function.

The method includes providing a semiconductor substrate, forming a conductive pad on the semiconductor substrate, and forming a first interlayer insulating layer on the surface of the resultant structure having the conductive pad. A first interconnection and a second interconnection disposed substantially parallel to each other then can be formed on the first interlayer insulating layer. The method further includes forming mask patterns on the respective first and second interconnections, each mask pattern being wider than the interconnection thereunder, and forming a conductive layer penetrating a region between the mask patterns, a region between the first and second interconnections, and a predetermined region of the first interlayer insulating layer. In the self-aligned contact structure, the conductive layer is in electrical contact with the conductive pad.

It is preferred in an embodiment of the invention to form the first and second interconnections by sequentially forming a first etch stop layer, a second interlayer insulating layer, a second etch stop layer, a third interlayer insulating layer, and a third etch stop layer on the first interlayer insulating layer. The third etch stop layer, the third interlayer insulating layer, and the second etch stop layer then can be successively patterned to form a first recessed region having sidewalls and a second recessed region having sidewalls, where the first and second recessed regions are substantially parallel (preferably parallel) to each other. A first spacer then can be formed on sidewalls of the first and second recessed regions. The second interlayer insulating layer and the first etch stop layer then may be successively etched using the third etch stop layer and the first spacer as etching masks, thereby forming a first interconnection groove and a second interconnection groove. A first interconnection (preferably a first interconnection line) and a second interconnection (preferably a. second interconnection line) then can be formed in the first interconnection groove and the second interconnection groove, respectively. It is preferred that the first interconnection and second interconnection are formed using a damascene technology.

The first to third interlayer insulating layers preferably are formed of an insulating layer having an etch selectivity with respect to the first to third etch stop layers and the first spacer. In addition, the first to third interlayer insulating layers preferably are formed of an insulating layer having a relatively low dielectric constant, when compared to the dielectric constant of the first to third etch stop layers and the first spacer. For example, the first to third insulating layers may be comprised of silicon oxide, and the first to third etch stop layers, and the first spacer, may be comprised of silicon nitride. When fabricating a high performance semiconductor device, the first and second interconnections preferably are formed of a metal layer, such as a tungsten layer. Preferably, the third etch stop layer is thicker than the total combined thickness of the first etch stop layer and the second etch stop layer.

Forming the mask patterns preferably includes forming a fourth etch stop layer over the surface (preferably the entire surface) of the resultant structure having the first and second interconnections, whereby the fourth etch stop layer fills the first and second recessed regions. The fourth etch stop layer and the third etch stop layer then may be blanket-etched in sequence until the third interlayer insulating layer is exposed to thereby form fourth etch stop layer patterns inside the recessed regions. In this embodiment, the fourth etch stop layer patterns and the first spacer on a sidewall thereof, constitute a mask pattern. As a result, the mask pattern is wider than the interconnection thereunder. The fourth etch stop layer preferably is formed of the same material layer as the third etch stop layer.

After forming the fourth etch stop layer pattern, the third interlayer insulating layer exposed by the blanket-etching process may be selectively removed to thereby expose a sidewall of the first spacer and a top surface of the second etch stop layer. Then, a second spacer may be formed on the exposed sidewall of the first spacer. At this time, after forming the second spacer, the second etch stop layer can be successively etched to expose the second interlayer insulating layer.

Forming the conductive layer includes successively anisotropic-etching the third interlayer insulating layer, the second etch stop layer, the second interlayer insulating layer, the first etch stop layer and the first interlayer insulating layer using the mask patterns as etching masks thereby forming a self-aligned contact hole exposing the conductive pad. The self-aligned contact hole then can be filled with the conductive layer.

An additional embodiment of the invention relates to a method of forming of forming a self-aligned contact structure in a semiconductor device. The method includes providing a semiconductor substrate, forming a conductive pad on the semiconductor substrate, and sequentially forming a first interlayer insulating layer, a first etch stop layer, a second interlayer insulating layer, a second etch stop layer, a third interlayer insulating layer and a third etch stop layer on the surface of the resultant structure having the conductive pad. The method also includes successively patterning the third etch stop layer, the third interlayer insulating layer and the second etch stop layer to form a first recessed region having at least a sidewall, and a second recessed region having at least a sidewall, whereby each of the first and second recessed regions are substantially parallel to each other.

The method further entails forming spacers on the sidewalls of the respective first and second recessed regions, and successively etching the second interlayer insulating layer and the first etch stop layer using the third etch stop layer and the spacers as etching masks to form first and second interconnection grooves. A first interconnection and a second interconnection then can be formed in the first interconnection groove, and in the second interconnection groove, respectively. Fourth etch stop layer patterns then can be formed in the respective first and second recessed regions, and the third etch stop layer concurrently removed. The method is completed by successively anisotropic-etching the third interlayer insulating layer, the second etch stop layer, the second interlayer insulating layer, the first etch stop layer and the first interlayer insulating layer using the spacers and the fourth etch stop layer patterns as etching masks to thereby form a contact hole exposing the conductive pad.

It is preferred in an embodiment of the invention to form the first and second interconnections by forming a metal layer over the surface (preferably the entire surface) of the resultant structure having the first and second interconnection grooves, and filling the first and second interconnection grooves. The first and second interconnections can be completed by etching-back the metal layer until the third etch stop layer and the spacer are exposed.

It also is preferred that the fourth etch stop layer patterns are formed by forming a fourth etch stop layer over the surface (preferably the entire surface) of the resultant structure having the first and second interconnections, and filling the first and second recessed regions. The fourth etch stop layer patterns can be completed by successively blanket-etching the fourth etch stop layer and the third etch stop layer until the third interlayer insulating layer is exposed.

An additional embodiment of the invention relates to a method of forming a self-aligned contact structure in a semiconductor device that includes providing a semiconductor substrate, and forming a conductive pad on the semiconductor substrate. The method also includes sequentially forming a first interlayer insulating layer, a first etch stop layer, a second interlayer insulating layer, a second etch stop layer, a third interlayer insulating layer and a third etch stop layer on the surface of the resultant structure having the conductive pad. The third etch stop layer, the third interlayer insulating layer and the second etch stop layer can be successively patterned to form a first recessed region having at least a sidewall, and a second recessed region having at least a sidewall, whereby each of the first and second recessed regions are substantially parallel to each other.

The method also entails forming first spacers on the sidewalls of the respective recessed regions, and successively etching the second interlayer insulating layer and the first etch stop layer using the third etch stop layer and the first spacers as etching masks to form first and second interconnection grooves. A first interconnection and a second interconnection then can be formed in the first interconnection groove, and in the second interconnection groove, respectively. Fourth etch stop layer patterns then can be formed in the respective first and second recessed regions, and the third etch stop layer concurrently removed. The method further includes removing the third interlayer insulating layer to expose sidewalls of the first spacers, forming second spacers on the exposed sidewalls of the first spacers, and etching the second etch stop layer that is present between the second spacers. The self-aligned contact can be completed by successively anisotropic-etching the second interlayer insulating layer, the first etch stop layer and the first interlayer insulating layer using the fourth etch stop layer patterns, the first spacers and the second spacers as etching masks, to thereby form a contact hole exposing the conductive pad.

Self-aligned contact structures according to embodiments of the present invention will now be described with reference to FIGS. 1 and 2A through 2F. Referring to FIG. 1, an active region 1 preferably is defined at a predetermined region of a p-type semiconductor substrate, and a pair of word lines 3a and 3b run over the active region 1 in substantial parallel arrangement with one another. Thus, the active region 1 is divided into three regions. The active region 1 between the pair of word lines 3a and 3b corresponds to a common drain region, designated as D in FIG. 1, which preferably is doped with n-type impurities. The active regions 1 at both sides of the common drain region D (e.g., on the periphery of word lines 3a and 3b) correspond to a first source. region S1 that preferably is doped with n-type impurities, and a second source region S2 that preferably is doped with n-type impurities. An isolation layer (not shown) usually is formed at an outside region of the active region 1.

A first storage node pad 17a can be disposed on the first source region S1, whereby the first storage node pad 17a is electrically connected to the first source region S1. Similarly, second storage node pad 17b may be disposed on the second source region S2, whereby the second storage node pad 17b is electrically connected to the second source region S2. In addition, a bit line pad 17d can be disposed on the common drain region D, whereby the bit line pad 17d is electrically connected to the common drain region D. The bit line pad 17d preferably comprises a protrusion extended toward one side of the active region 1. First and second bit lines 35a and 35b can be disposed across the pair of word lines 3a and 3b. The first bit line 35a preferably is electrically connected to the bit line pad 17d through a bit line contact hole 7 exposing the protrusion of the bit line pad 17d. In a similar vein, the second bit line 35b may be electrically connected to another bit line pad (not shown).

Figure 2A:
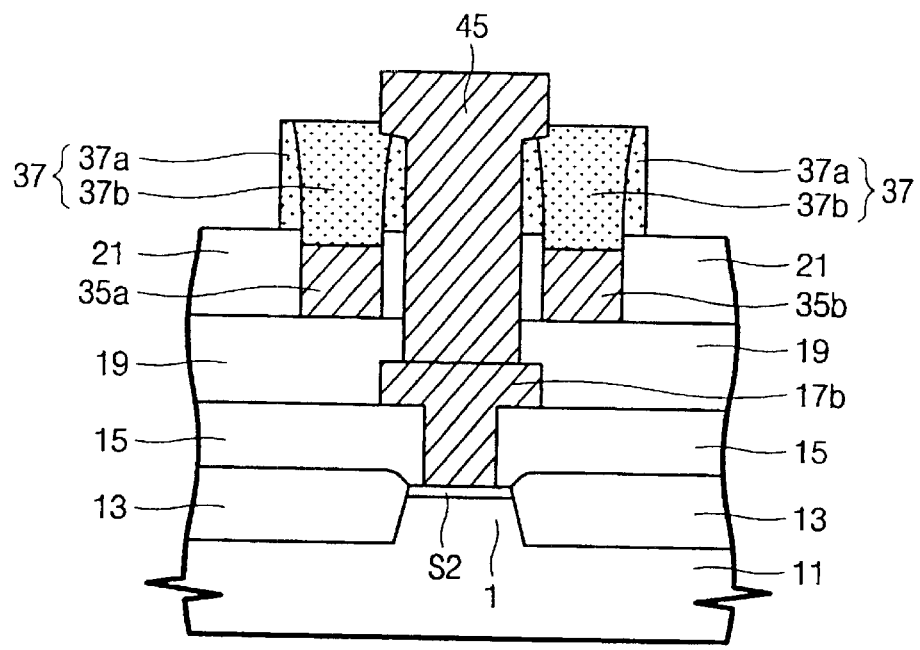
FIG. 2A is a cross-sectional view illustrating a self-aligned contact structure according to an embodiment of the present invention taken along line I—I of FIG. 1.

FIG. 2A shows a cross-sectional view of the self-aligned contact structure taken along line I—I of FIG. 1, and shows an isolation layer 13 defining an active region (e.g., active region 1 of FIG. 1) formed at a predetermined region of a semiconductor substrate 11. A predetermined region of the active region 1 preferably is doped with impurities having a different conductivity than the substrate 11 to thereby form a source region, for example, a second source region S2. The second source region S2 and the isolation layer 13 may be covered with a planarized insulating layer 15. A conductive pad, e.g., a second storage node pad 17b may be disposed over the second source region S2. The second storage node pad 17b preferably is electrically connected to the second source region S2 through a hole penetrating a predetermined region of the planarized insulating layer 15. The second storage node pad 17b and the planarized insulating layer 15 then may be covered with a first interlayer insulating layer 19, and then the first interlayer insulating layer 19 covered with a second interlayer insulating layer 21. Preferably, the first and second interlayer insulating layers 19 and 21 are insulating layers having a relatively low dielectric constant, for example, silicon oxide layers.

A conductive layer pattern 45 penetrating the first and second interlayer insulating layers 19 and 21 preferably is located on the second storage node pad 17b. Also, first and second interconnections 35a and 35b may be disposed at both sides of the conductive layer pattern 45. The first and second interconnections 35a and 35b preferably are embedded in the second interlayer insulating layer 21 and are substantially parallel to each other. Thus, the second interlayer insulating layer 21 is interposed between the conductive layer pattern 45 and the respective interconnections 35a and 35b. The first and second interconnections 35a and 35b preferably are formed of a conductive layer material, such as a metal layer. In more detail, the first and second interconnections 35a and 35b may be comprised of a barrier metal layer and an interconnection metal layer, which are sequentially stacked. The barrier metal layer may be a titanium nitride (TiN) layer or a tantalum nitride (TaN) layer. Also, the interconnection metal layer may be a tungsten (W) layer.

Figure 2B:
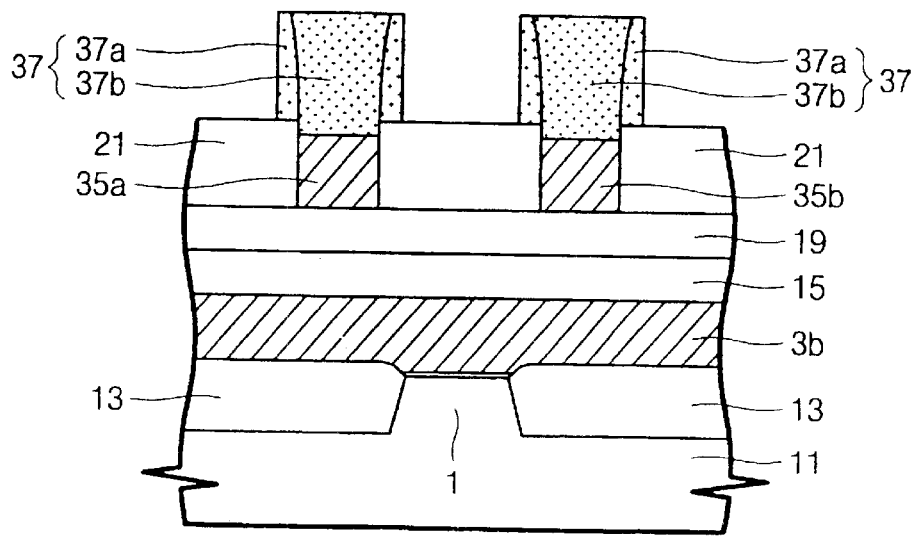
FIG. 2B is a cross-sectional view illustrating a self-aligned contact structure according to an embodiment of the present invention taken along line II—II of FIG. 1.

A T-shaped mask pattern 37, preferably is located on each interconnection 35a or 35b. The T-shaped mask pattern 37 typically comprises an etch stop layer pattern 37b on each interconnection 35a or 35b and a first spacer 37a preferably provided on at least one sidewall of the etch stop layer pattern 37b. Thus, the width of the mask pattern 37 at its upper portion, preferably above second interlayer insulating layer 21, is greater than the width of the interconnection 35a or 35b thereunder. The relationship can be explained by the use of a formula, wherein if the width of the interconnections 35a and 35b are designated x, and the width of the top portion of the mask pattern 37 is designated z with the width of the bottom portion of the mask pattern being designated y, then in the scope of the present invention, $x \leq y \leq z$ and $x<z$. This equation is a critical aspect of the present invention in that it ensures that the contact structure is self-aligned. The conductive layer pattern 45 preferably is extended to penetrate a region between the adjacent mask patterns 37. FIG. 2B shows a cross-sectional view of the self-aligned contact structure taken along line II—II of FIG. 1, and shows an isolation layer 13 defining an active region (e.g., active region 1 of FIG. 1) formed at a predetermined region of a semiconductor substrate 11. The word line 3b is formed over and electrically connected to the active region 1. The planarizing insulating layer 15 is formed over the word line 3b, and the first interlayer insulating layer 19 is formed over the planarizing insulating layer 15. The second interlayer insulating layer 21 is formed over the first interlayer insulating layer 19, and the first bit line 35a and the second bit line 35b are embedded in the second interlayer insulating layer 21. A mask pattern 37 is disposed above the bit lines 35a and 35b. The mask pattern 37 has an etch stop layer pattern 37b and a first spacer 37a, as mentioned previously.

Figure 2C:
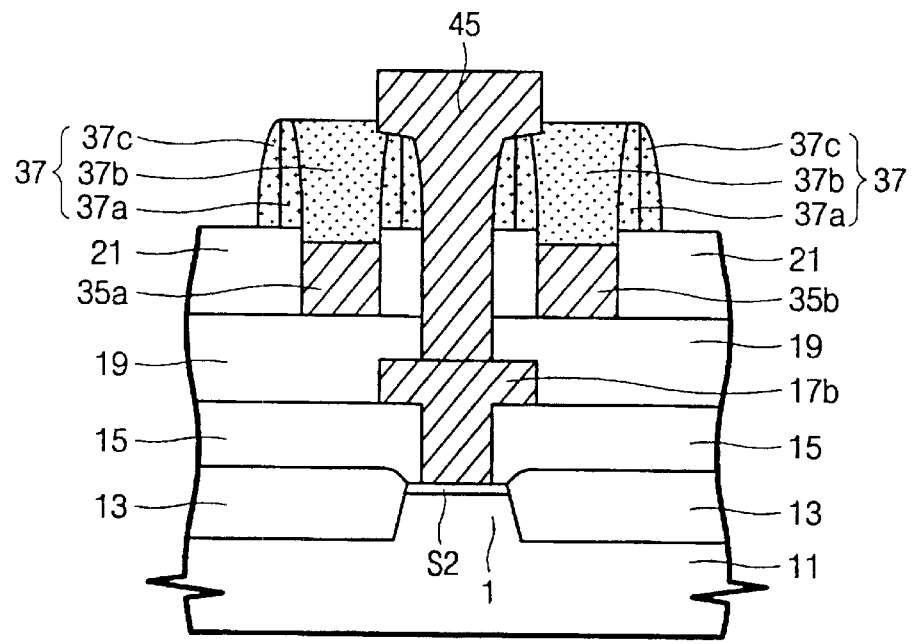
FIG. 2C is a cross-sectional view similar to FIG. 2A illustrating a self-aligned contact structure according to an embodiment of the present invention having double spacers taken along line I—I of FIG. 1.

Referring to FIG. 2C. a second spacer 37c may be additionally formed on at least one sidewall of the first spacer 37a. Here, the second spacer 37c may be interposed between the conductive layer pattern 45 and the first spacer 37a of the mask pattern 37. The mask pattern 37, including the etch stop pattern 37b, the first spacer 37a, and the second spacer 37c, preferably is formed of an insulating layer material having a relatively high dielectric constant, when compared with the first and second interlayer insulating layers 19 and 21. Preferably, the etch stop pattern 37b, the first spacer 37a, and the second spacer 37c are all made of the same material, for example, silicon nitride.

Figure 2D:
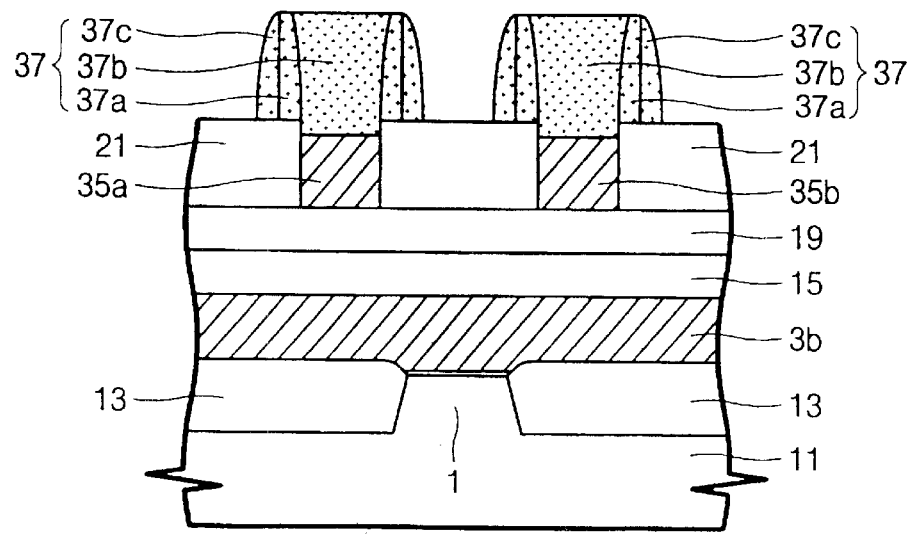
FIG. 2D is a cross-sectional view similar to FIG. 2B illustrating a self-aligned contact structure according to an embodiment of the present invention having double spacers taken along line II—II of FIG. 1.

FIG. 2D shows the self-aligned contact structure shown in FIG. 2B, with the addition of the second spacer 37c.

Figure 2E:
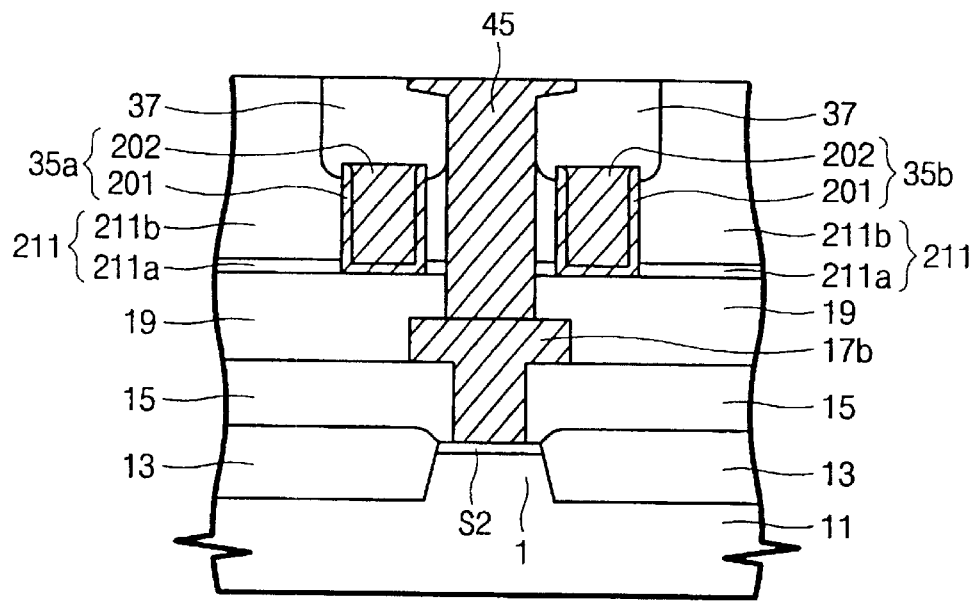
FIG. 2E is a cross-sectional view illustrating a self-aligned contact structure according to an embodiment of the present invention taken along line I—I of FIG. 1, corresponding to the view shown in FIG. 2A, shown with an isolation layer that has not yet been consumed by an etching process.

Referring to FIG. 2E, an isolation layer 13 defining an active region 1 is formed at a predetermined region of a semiconductor substrate 11. The isolation layer 13 is covered with a planarized insulation layer 15. A conductive pad 17b penetrates the planarized insulation layer 15 above the active region 1, and the conductive pad 17b is electrically connected to the semiconductor substrate 11. The conductive pad 17b and the planarized insulating layer 15 are covered with a first interlayer insulating layer 19. The first interlayer insulating layer 19 is covered with a second interlayer insulating layer 211. Optionally, an etch stop layer 211a may be interposed between the first and second interlayer insulating layers 19 and 211b. A conductive layer pattern 45 penetrating the first and second interlayer insulating layers 19 and 211 preferably is located on the conductive pad 17b. Also, first and second interconnections 35a and 35b may be disposed at both sides of the conductive layer pattern 45. The first and second interconnections 35a and 35b preferably are embedded in the second interlayer insulating layer 211 and are substantially parallel to each other. Thus, the second interlayer insulating layer 211 is interposed between the conductive layer pattern 45 and the respective interconnections 35a and 35b.

The first and second interconnections 35a and 35b preferably are formed of a conductive layer material, such as a metal layer. In more detail, each of the first and second interconnections 35a and 35b may be comprised of an interconnection metal layer 202 and a barrier metal layer 201. The barrier metal layer 201 may surround the sidewall and bottom of the interconnection metal layer 202. The barrier metal layer 201 may be a titanium nitride (TiN) layer or a tantalum nitride (TaN) layer. Also, the interconnection metal layer may be a tungsten (W) layer.

A mask pattern 37 preferably is located on each interconnection 35a and 35b. The mask patterns 37 are also embedded in the second interlayer interconnection layer 211 and are substantially parallel to each other like the interconnections 35a and 35b. The width of the mask pattern 37 at its upper portion is greater the width of the interconnection thereunder. In particular, the mask pattern 37 preferably has a vertical sidewall profile that is perpendicular to the top surface of the substrate 11.

The conductive layer pattern 45 preferably is extended to penetrate a region between the adjacent mask patterns 37. The mask patterns 37 preferably is formed of an insulating layer material having a relatively high dielectric constant, when compared with the first and second interlayer insulating layers 19 and 211. Preferably, the mask pattern 37 is made of silicon nitride.

Figure 2F:
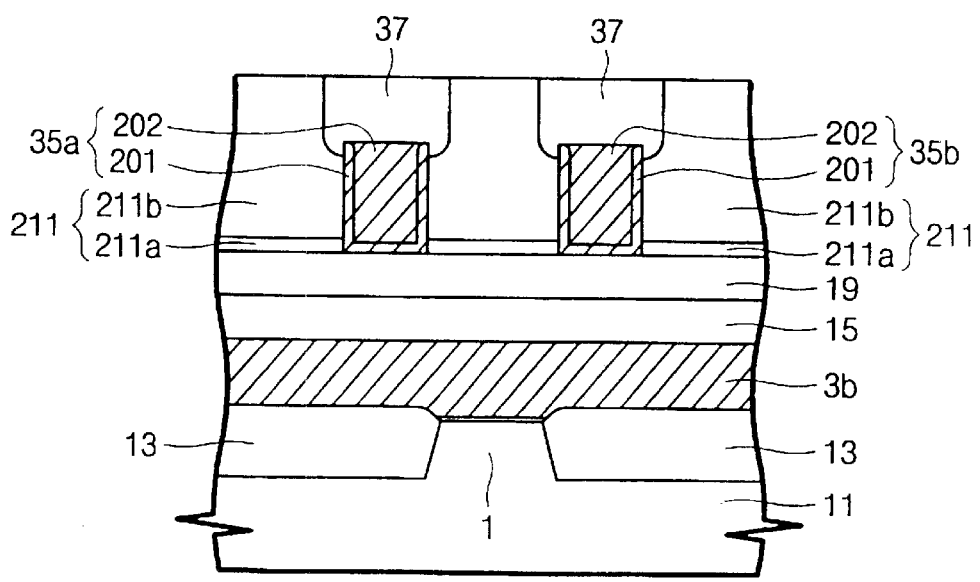
FIG. 2F is a cross-sectional view illustrating a self-aligned contact structure according to an embodiment of the present invention taken along line II—II of FIG. 1, corresponding to the view shown in FIG. 2B, shown with an isolation layer that has not vet been consumed by an etching process.

FIG. 2F shows a cross-sectional view of the self-aligned contact structure shown in FIG. 2E taken along line II—II of FIG. 1.

Methods of forming a self-aligned contact structure according to various embodiments of the present invention will be described with reference to the drawings. FIGS. 3A–3G represent cross-sectional views illustrating a method of forming a self-aligned contact structure according to one embodiment of the present invention. The cross-sectional views in FIGS. 3A–3G are taken along the line I—I of FIG. 1.

Figure 3A:
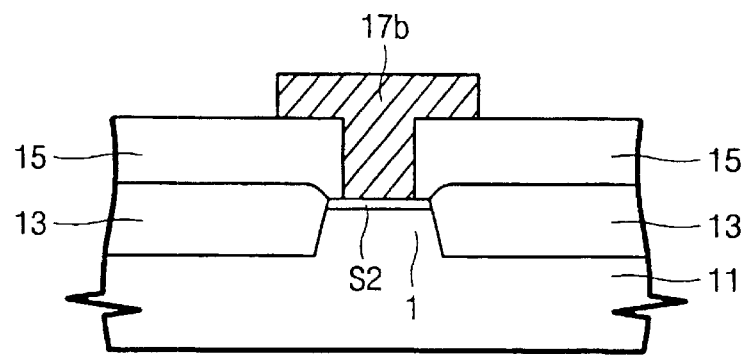
FIGS. 3A–3G are cross-sectional views along line I—I of FIG. 1 illustrating a method of forming a self-aligned contact structure according to another embodiment of the present invention.

Referring now to FIG. 3A, an isolation layer 13 may be formed at a predetermined region of a p-type semiconductor substrate 11 in order to define an active region. The isolation layer 13 may be formed using a conventional layer forming technology such as a LOCOS (local oxidation of silicon) process or a trench isolation process. Skilled artisans are capable of forming isolation layer 13 using the guidelines provided herein. A pair of word lines (3a and 3b of FIG. 1, but not shown in FIG. 3A) then may be formed over the active region. N-type impurities then preferably are ion-implanted into the semiconductor substrate 11 using the word lines as ion implantation masks to form a second source region S2. At this time, a common drain region D and first source region S1 of FIG. 1 also may be formed in a similar manner.

The isolation layer 13, the source regions S1 and S2 and the common drain region D then can be covered with a planarized insulating layer 15. The planarized insulating layer 15 can be patterned to form a pad contact hole that exposes the second source region S2. At this time, pad contact holes exposing the first source region S1 and the common drain region D also are formed in a similar manner. A conductive layer, for example, a doped polysilicon layer (not shown) then can be formed on the surface (preferably the entire surface) of the resultant structure having the pad contact holes. The conductive layer preferably is patterned to form a conductive pad, e.g., a second storage node pad 17b, which is electrically connected to the second source region S2. At this time, a first storage node padi (17a of FIG. 1) connected to the first source region S1 and a bit line pad (17d of FIG. 1) connected to the common drain region D also can be formed in a similar manner.

Figure 3B:
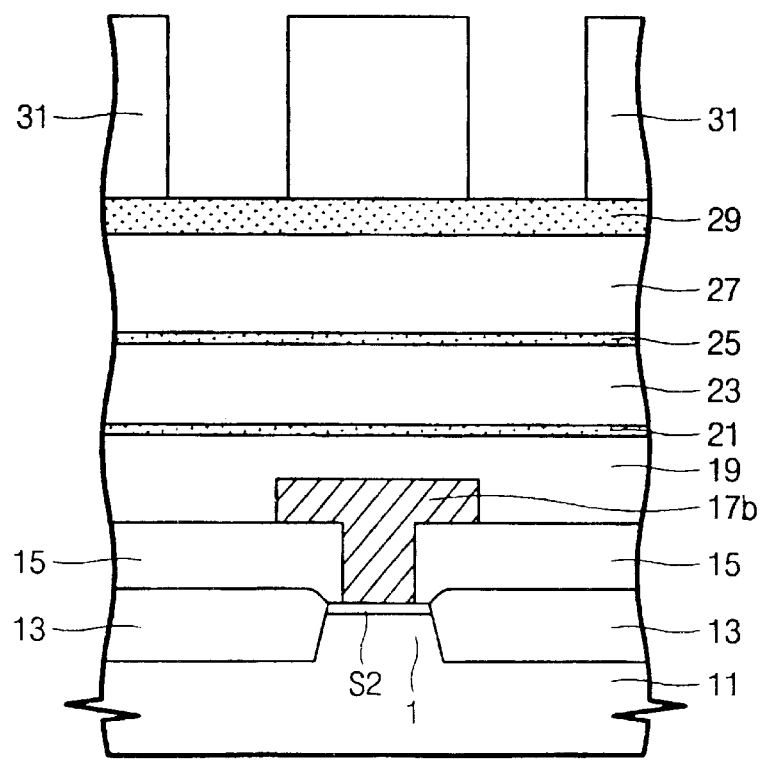

Referring to FIG. 3B, a first interlayer insulating layer 19, a first etch stop layer 21, a second interlayer insulating layer 23, a second etch stop layer 25, a third interlayer insulating layer 27 and a third etch stop layer 29 preferably are sequentially formed on the surface (preferably the entire surface) of the resultant structure having the second storage node pad 17b. The first to third interlayer insulating layers 19, 23 and 27 preferably are formed of silicon oxide. Also, the first to third interlayer insulating layers 19, 23, and 27 preferably are formed of an insulating layer material that has an etch selectivity with respect to the first to third etch stop layers 21, 25, and 29. The etch stop layers 21, 25, and 29 preferably are silicon nitride layers. In addition, the third etch stop layer 29 preferably is thicker than the total combined thicknesses of the first etch stop layer 21 and the second etch stop layer 25. The third etch stop layer is thicker so that it is not removed completely during formation of the self-aligned contact hole that penetrates the first and second etch stop layers 21 and 25 in a subsequent process. First photoresist pattern 31 then can be formed on the third etch stop layer 29. Skilled artisans are capable of sequentially forming the interlayer insulating layers, etch stop layers, and first photoresist pattern 31, using the guidelines provided herein.

Figure 3C:
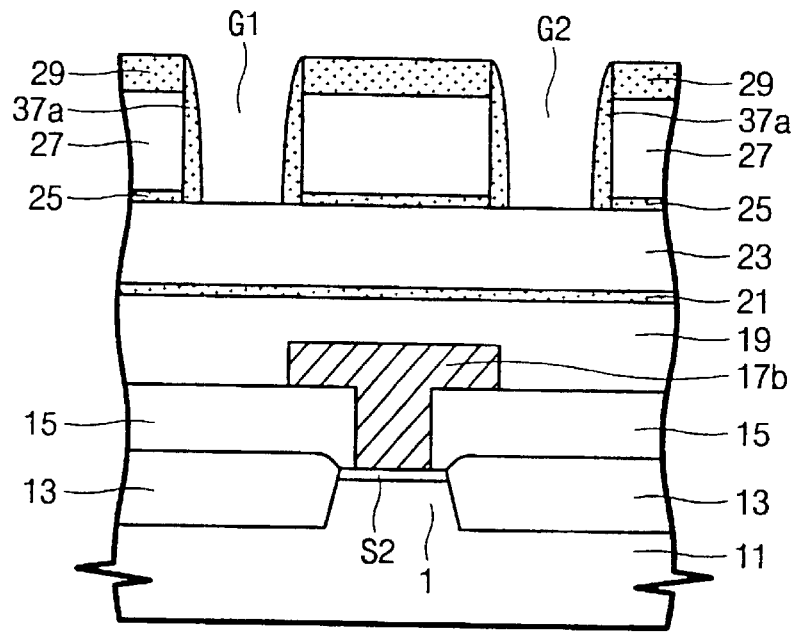

Referring now to FIG. 3C, the third etch stop layer 29, the third interlayer insulating layer 27 and the second etch stop layer preferably are successively etched using the first photoresist pattern 31 as an etching mask, thereby forming a first recessed region G1, and a second recessed region G2 that are substantially parallel to each other. Preferably, first recessed region G1 and second recessed region G2 are parallel to each other. The first photoresist pattern 31 then can be removed using conventional techniques. The resultant structure where the first photoresist pattern 31 is removed then can be covered with a conformal insulating layer having an etching selectivity with respect to the first and second interlayer insulating layers 19 and 23. The conformal insulating layer preferably is a silicon nitride layer. The conformal layer then can be anisotropic-etched to form a spacer 37a on sidewalls of the first and second recessed regions G1 and G2. Alternatively, the first and second recessed regions G1 and G2 may be formed by sequentially etching the third etch stop layer 29 and the third interlayer insulating layer 27, using the first photoresist pattern 31 as an etching mask. In this embodiment, after forming the spacer 37a, the second etch stop layer 25 can be etched to expose the second interlayer insulating layer 23.

Figure 3D:
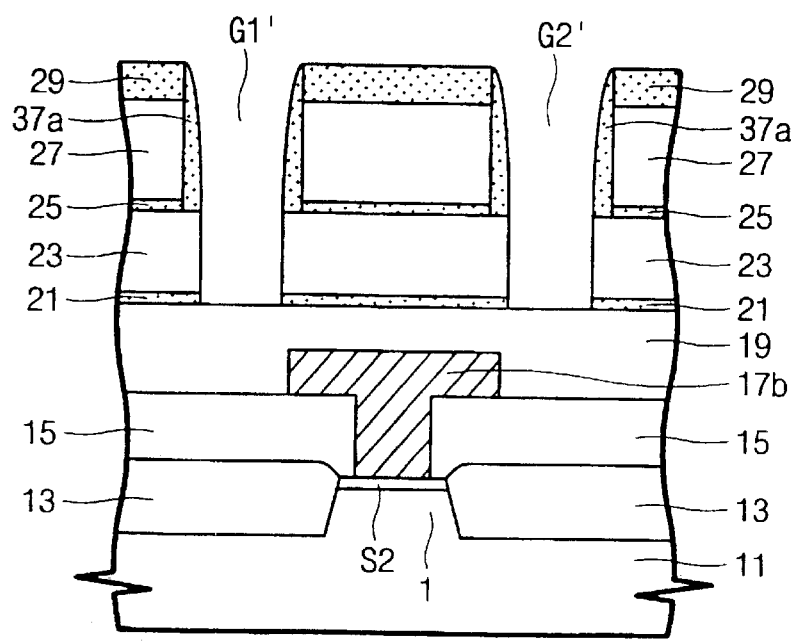

Referring now to FIG. 3D, the second interlayer insulating layer 23 and the first etch stop layer 21 then may be successively etched using the third etch stop layer 29 and the spacer 37a as etching masks, thereby forming a first interconnection groove G1' and a second interconnection groove G2' that are substantially parallel, (preferably parallel), to each other. Subsequently, though not shown in FIG. 3D, predetermined regions of the first interlayer insulating layer 19 which are exposed by the first and second interconnection grooves G1' and G2' can be etched to form bit line contact holes (7 of FIG.1) exposing bit line pads (17d of FIG. 1).

Figure 3E:
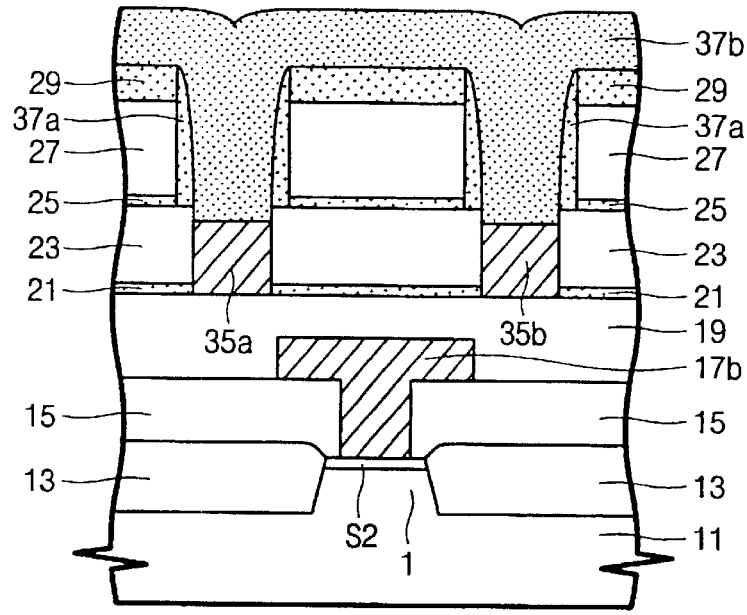

Referring to FIG. 3E, the resultant structure where the bit line contact holes are formed, preferably is covered with a metal layer filling at least the bit line contact holes and the interconnection grooves G1' and G2'. Preferably, the metal layer is formed by sequentially stacking a barrier metal layer and an interconnection metal layer. A titanium nitride (TiN) layer, or a tantalum nitride (laN) layer preferably are used as the barrier metal layer, and a tungsten (W) layer preferably is used as the interconnection metal layer. The interconnection metal layer then can be etched-back until the third etch stop layer 29 and the spacer 37a are exposed, thereby forming a first interconnection 35a and a second interconnection 35b in the first interconnection groove G1' and in the second interconnection groove G2', respectively. At this time, the interconnection metal layer may be over-etched until upper sidewalls of the first and second interconnection grooves G1' and G2' are exposed, as shown in FIG. 3E.

As described above, the first and second interconnections 35a and 35b preferably are formed using a damascene process. In other words, there is no need to use photolithography and etching processes for directly patterning the metal layer. Accordingly, the process of this embodiment of the invention can substantially prevent bridges or stringers from being formed between the adjacent interconnections. In particular, in the event that the interconnections are formed by directly patterning the metal layer using photolithography and etching processes, bridges composed of metal residues may be left between the interconnections. This is because the photoresist pattern on the metal layer has a poor side wall profile due to irregular reflections that may occur during the photolithography process. In the event that the metal layer has a rough surface, the irregular reflections occur even more severely. In addition, the material used for the etching metal layer generally exhibits a relatively low etching selectivity with respect to the photoresist pattern that is to be used as an etching mask, when compared to the material used for the etching insulating layer, such as silicon oxide or silicon nitride. Thus it is difficult to perform an over-etching process to remove the bridges. As a result, using the damascene process to form the interconnections as in the present invention, (as opposed to using a photolithography process), makes it easy to solve the metal bridge problem.

A fourth etch stop layer 37b filling the first and second recessed regions G1 and G2 then can be formed over the surface (preferably the entire surface) of the resultant structure having the first and second interconnections 35a and 35b. The fourth etch stop layer 37b preferably is comprised of the same material as that used to form the first to third etch stop layers 21, 25, and 29. Preferably, fourth, etch stop layer 37b is comprised of silicon nitride.

Figure 3F:
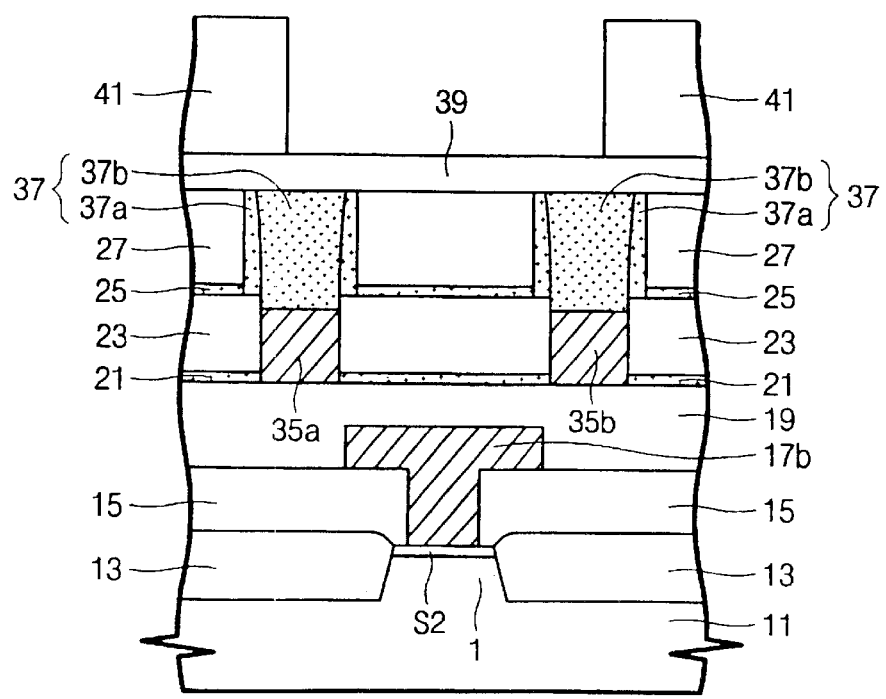

Referring now to FIG. 3F, the fourth etch stop layer 37b then can be blanket-etched until a top surface of the third interlayer insulating layer 27 is exposed, thereby forming fourth etch stop layer patterns 37b in the first and second recessed regions G1 and G2. The fourth etch stop layer patterns 37b and spacer 37a on a sidewall of the fourth etch stop layer patterns 37b now constitute mask pattern 37. Here, in the event that the top surfaces of the first and second interconnections 35a and 35b are lower than that of the second interlayer insulating layer 23, the mask pattern 37 is T-shaped. For example, in this embodiment, the mask pattern 37 is wider than the interconnection thereunder, as shown in FIG. 3F.

A fourth interlayer insulating layer 39 then can be formed over the surface (preferably the entire surface) of the resultant structure where the fourth etch stop layer patterns 37a are formed. The process for forming the fourth interlayer insulating layer 39 may be omitted, if desired. The fourth interlayer insulating layer 39 preferably is comprised of the same material as that used to form the first to third interlayer insulating layers 19, 23, and 27. Preferably, fourth interlayer insulating layer 39 is comprised of silicon oxide.

A second photoresist pattern 41 then can be formed on the fourth interlayer insulating layer 39. The second photoresist pattern 41 has openings above the storage node pads 17a and 17b. At this time, the widths of the openings may be wider than those of the storage node pads 17a and 17b. This serves to increase the alignment margin of the second photoresist pattern 41.

Figure 3G:
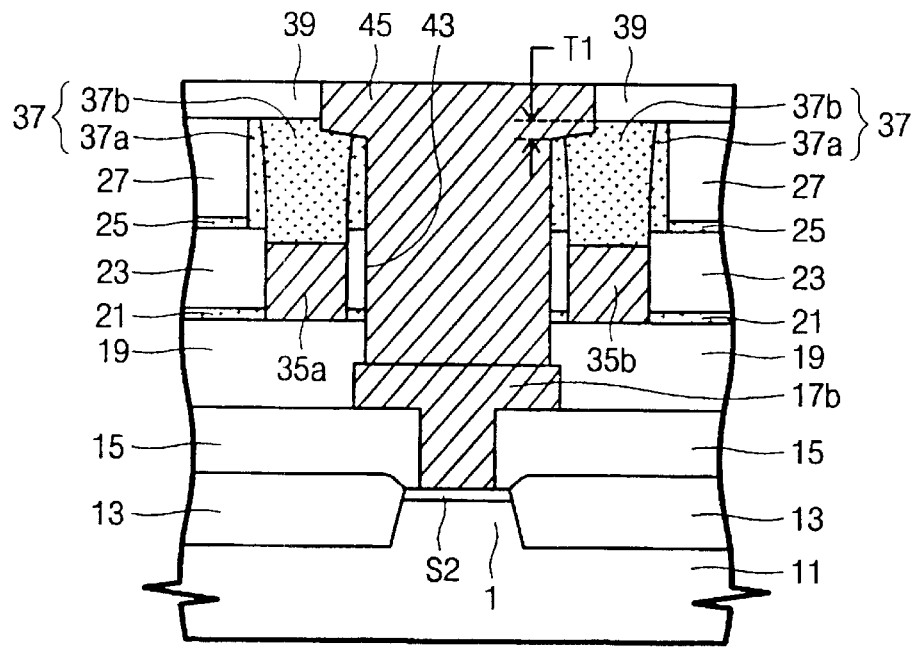

Referring to FIG. 3G, the fourth interlayer insulating layer 39, the third interlayer insulating layer 27, the second etch stop 20 layer. 25, the second interlayer insulating layer 23, the first etch stop layer 21, and the first interlayer insulating layer 19 can be successively etched using the second photoresist pattern 41 and the mask patterns 37 as etching masks. Successively etching the respective layers in this manner forms contact holes 43, and exposes the storage node pads 17a and 17b. At this time, upper corners of the mask patterns 37 may be etched to a first depth T1 during etching of the first and second etch stop layers 21 and 25.

The second photoresist pattern 41 then can be removed. A conductive layer, (for example, a doped polysilicon layer), filling the contact holes 43 can be formed over the surface (preferably over the entire surface) of the resultant structure where the second photoresist pattern 41 is removed. The conductive layer then can be patterned to form conductive layer pattern 45, which is electrically connected to the storage node pads 17a and 17b in the respective contact holes 43. The conductive layer can be patterned using a conventional technology such as a photolithography process or a chemical mechanical polishing (CMP) process. Those skilled in the art are familiar with these processes, and are capable of patterning the conductive layer in accordance therewith, using the guidelines provided herein.

Figure 4A:
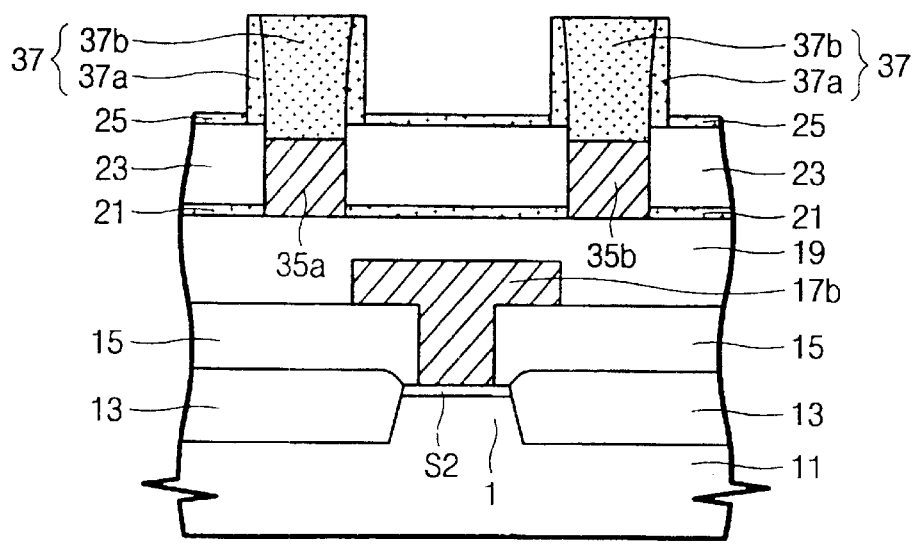
FIGS. 4A–4C are cross-sectional views along line I—I of FIG. 1 illustrating a method of forming a self-aligned contact structure according to another embodiment of the present invention.
Figure 4B:
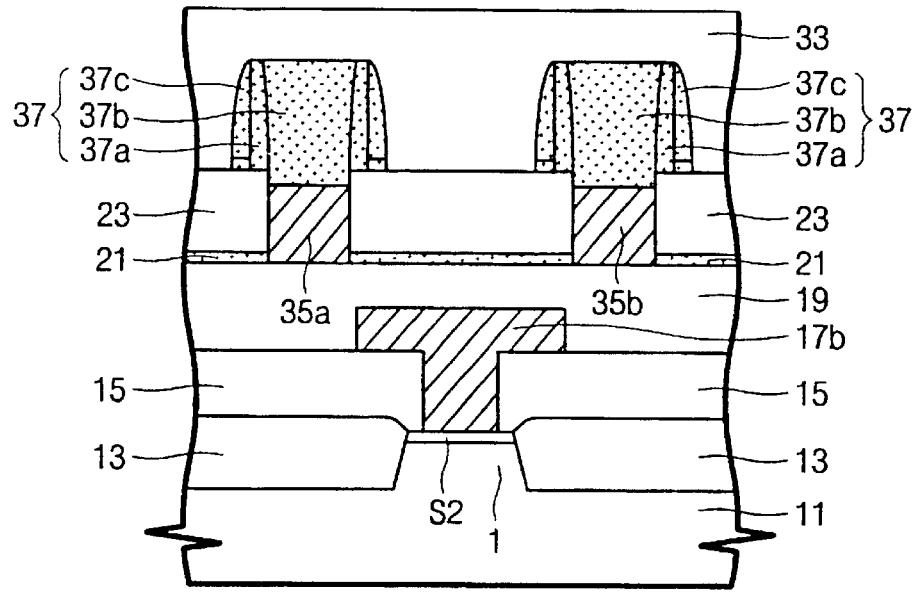
Figure 4C:
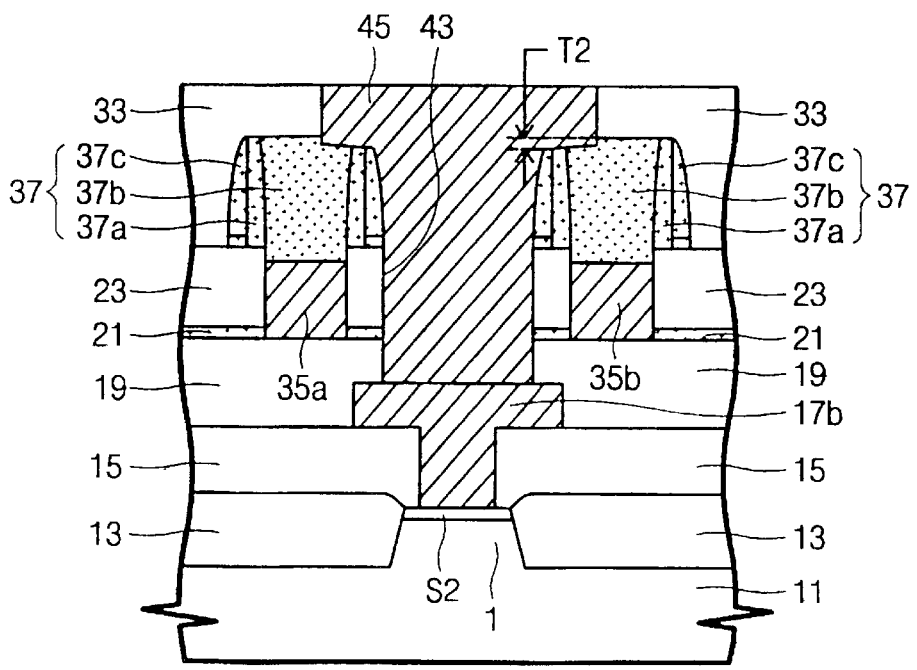

FIGS. 4A–4C are cross-sectional views illustrating a method of forming a self-aligned contact structure according to another embodiment of the present invention. The cross-sectional views of FIGS. 4A–4C are taken along the line I—I of FIG. 1.

Referring now to FIG. 4A, second storage node pad 17b (shown in FIG. 1), the first and second interconnections 35a and 35b, and the mask patterns 37 can be formed in the same manner as the embodiment of the present invention described above with reference to FIGS. 3A–3G. The third interlayer insulating layer (element 27 shown in FIG. 3F) preferably is selectively removed prior to formation of the fourth interlayer insulating layer 39, thereby exposing the sidewall of the spacer 37a, (i.e., first spacer and the second etch stop layer. 25). It is preferable that the third interlayer insulating layer 27 is removed using a wet etchant such as hydrofluoric acid (HF solution) or a buffered oxide etchant (BOE).

Referring now to FIG. 4B, the resultant structure where the third interlayer insulating layer 27 was removed now is covered with a conformal insulating layer having an etching selectivity with respect to the first and second interlayer insulating layers 19 and 23. Preferably, the conformal insulating layer is formed of the same material as the first and second etch stop layers 21 and 25. The conformal insulating layer then can be anisotropic-etched to form a second spacer 37c on the exposed sidewall of the first spacer 37a. At this time, the second etch stop layer 25 also is etched to expose the second interlayer insulating layer 23. A planarized interlayer insulating layer 33 then can be formed over the surface (preferably over the entire surface) of the resultant structure having the second spacer 37c. The planarized interlayer insulating layer 33 preferably is formed of the same material as the first to third interlayer insulating layers, for example, silicon oxide. The process for forming the planarized interlayer insulating layer 33 may be omitted, if desired.

Referring now to FIG 4C, a photoresist pattern (not shown) having the same shape as the second photoresist pattern 41 shown in FIG. 3F then can be formed on the planarized interlayer insulating layer 33. The planarized interlayer insulating layer 33, the second interlayer insulating layer 23, the first etch stop layer 21, and the first interlayer insulating layer 19 then can be successively anisotropic-etched using. the photoresist pattern, the mask patterns 37 and the second spacers 37c as etching masks. Successively etching the respective layers in this manner forms. contact holes 43, and exposes the storage node pads 17a and 17b. At this time, upper corners of the mask patterns 37 and upper portions of the second spacers 37c may be etched to a second depth T2 during etching of the first etch stop layers 21. The second depth T2 is shallower than the first depth T1 shown in FIG. 3G.

Subsequently, the photoresist pattern can be removed. A conductive layer 45 that is electrically connected to the storage node pad 17b then can be formed in the same manner as the embodiments of the present invention described above with reference to FIGS. 3A–3G.

FIGS. 5A–5G are cross-sectional views illustrating a method of forming a self-aligned contact structure according to still another embodiment of the present invention. The cross-sectional views of FIGS. 5A–5G are taken along the line I—I of FIG. 1.

Figure 5A:
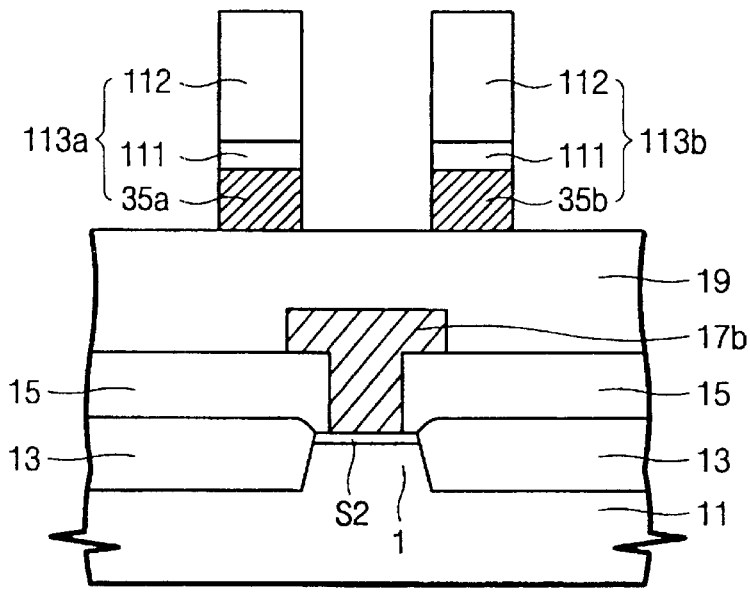
FIGS. 5A–5G are cross-sectional views along line I—I of FIG. 1 illustrating a method of forming a self-aligned contact structure according to still another embodiment of the present invention.

Referring to FIG. 5A, the planarized insulating layer 15, the conductive pad 17b (second storage node pad) and the first interlayer insulating layer 19 can be formed in the same manner as the embodiment of the present invention described above with reference to FIGS. 3A–3G. A conductive layer and a capping layer are sequentially formed on the first interlayer insulating layer 19. The conductive layer may be formed by sequentially stacking a barrier metal layer such as a titanium nitride layer and an interconnection metal layer such as a tungsten layer. Also, the capping layer may be formed by sequentially stacking a first capping layer and a second capping layer. Preferably, the first capping layer can be formed of a CVD silicon oxide layer such as a PE-TEOS (plasma enhanced tetraethylothosilicate) oxide layer or a HDP (high density plasma) oxide layer and the second capping layer can be formed of a silicon nitride layer or a polysilicon layer.

The capping layer and the conductive layer are patterned to form a pair of parallel interconnection patterns 113a and 113b. As a result, one interconnection pattern 113a comprises a first interconnection 35a, a first capping layer pattern 111 and a second capping layer pattern 112 which are sequentially stacked, and the other interconnection pattern 113b comprises a second interconnection 35b, a first capping layer pattern 111 and a second capping layer pattern 112 which are sequentially stacked. Herein the first and second interconnections 35a and 35b may act as bit lines of a semiconductor memory device such as a DRAM.

Figure 5B:
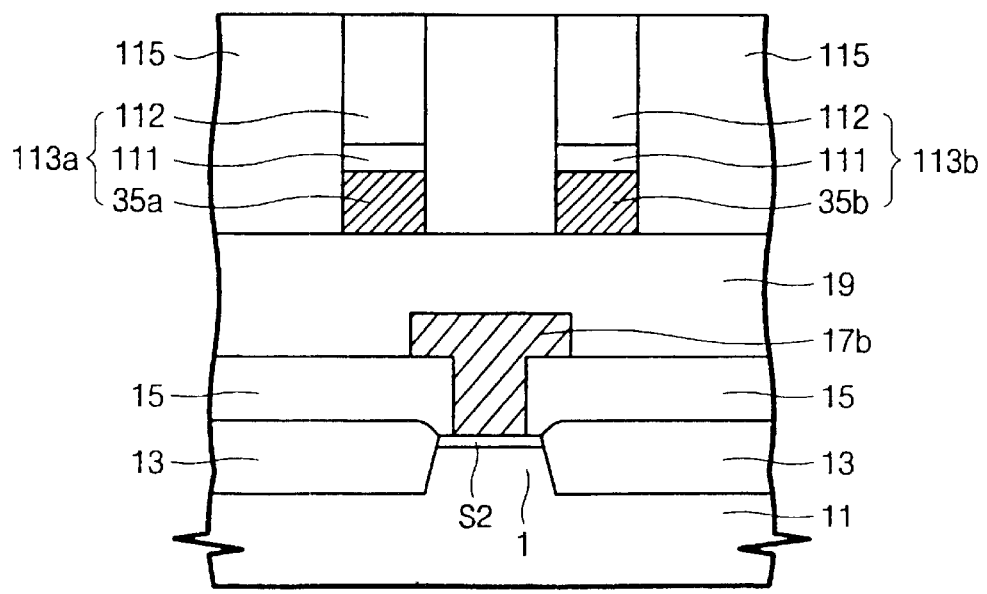

Referring to FIG. 5B, a second interlayer insulating layer 115 is formed on the entire surface of the resultant structure having the interconnection patterns 113a and 113b. The second interlayer insulating layer 115 is preferably formed of a CVD silicon oxide layer. The second interlayer insulating layer 115 is then planarized using a CMP (chemical mechanical polishing) technique until the top surfaces of the interconnection patterns 113a and 113b are exposed.

Figure 5C:
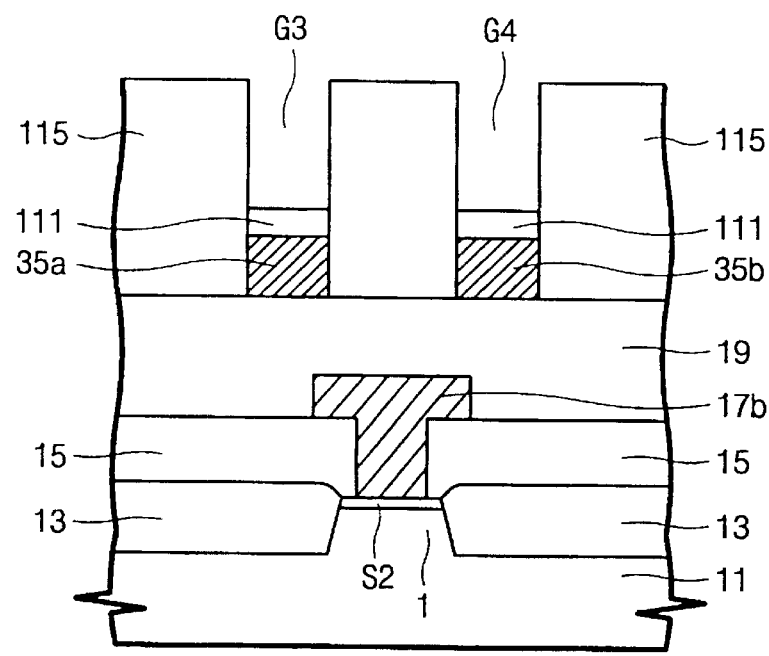

Referring to FIG. 5C, the second capping layer patterns 112 of each of the interconnection patterns 113a and 113b are selectively removed using an adequate wet etchant to form recessed regions G3 and G4, respectively, on each of the first capping layer patterns 111. The first capping layer patterns 111 protect the interconnections 35a and 35b from damage by the wet etchant.

Figure 5D:
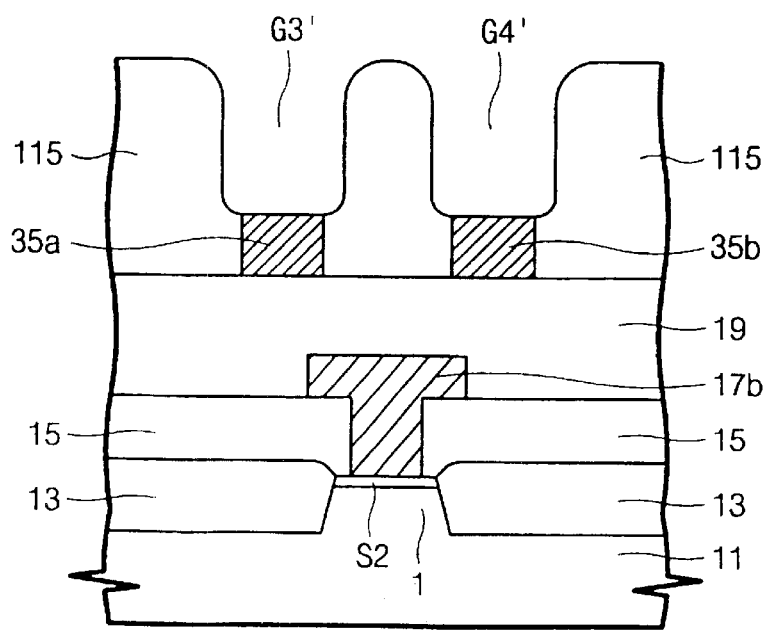

Referring to FIG. 5D, the second interlayer insulating layer 115 is isotropically etched to enlarge the recessed regions G3 and G4. The first capping layer patterns 111 may also be removed during this isotropic etching process. Thus, enlarged recessed regions G3' and G4' are formed on the interconnections 35a and 35b, respectively. As a result, the width of the enlarged recessed region G3' and G4' is wider than that of the interconnections 35a and 35b thereunder. Also, the sidewalls of the enlarged recessed regions G3' and G4' exhibit a vertical profile that is generally 71 perpendicular to the top surface of the semiconductor substrate 11 Is as shown in FIG. 5D.

Figure 5E:
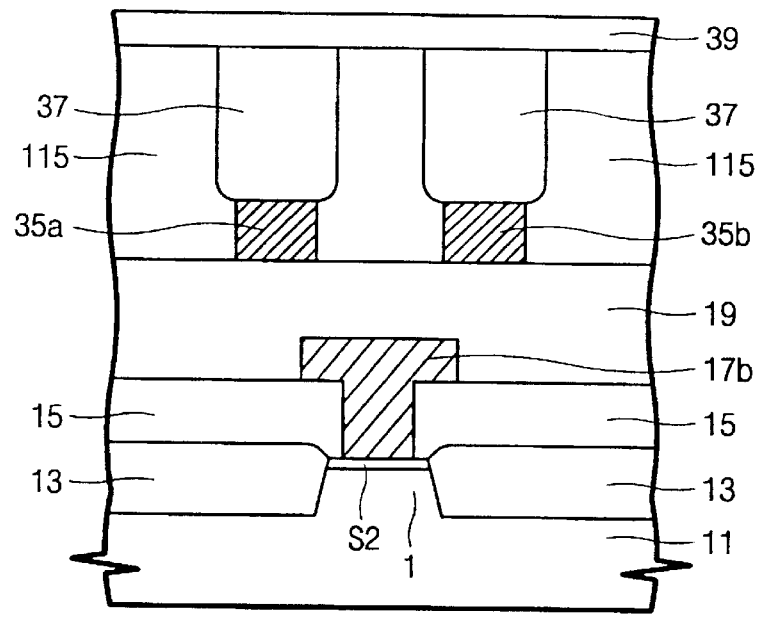

Referring to FIG. 5E, a mask layer is formed on the entire surface of the resultant structure where the enlarged recessed regions G3' and G4' are formed. It is preferable that the enlarged recessed regions G3' and G4' are completely filled with the material of the mask layer. The mask layer may be formed of a silicon nitride layer. The mask layer is planarized until the top surface of the second interlayer insulating layer 115 is exposed. As a result, mask patterns 37 are formed in the enlarged recessed regions G3' and G4'. The mask patterns 37 also have generally vertical sidewalls like the enlarged recessed regions G3' and G4'. A sacrificial layer 39 such as a silicon oxide layer is then formed on the entire surface of the resultant structure having the mask patterns 37.

Figure 5F:
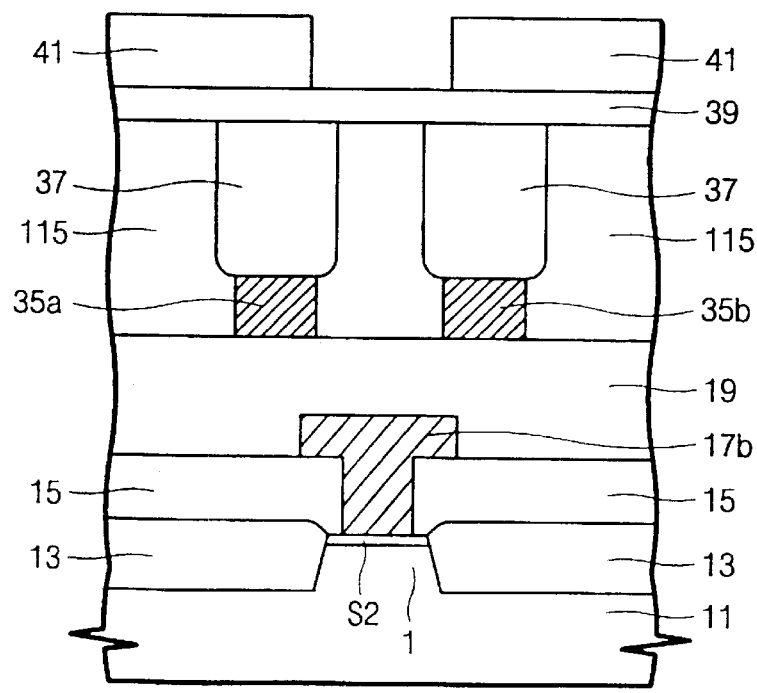
Figure 5G:
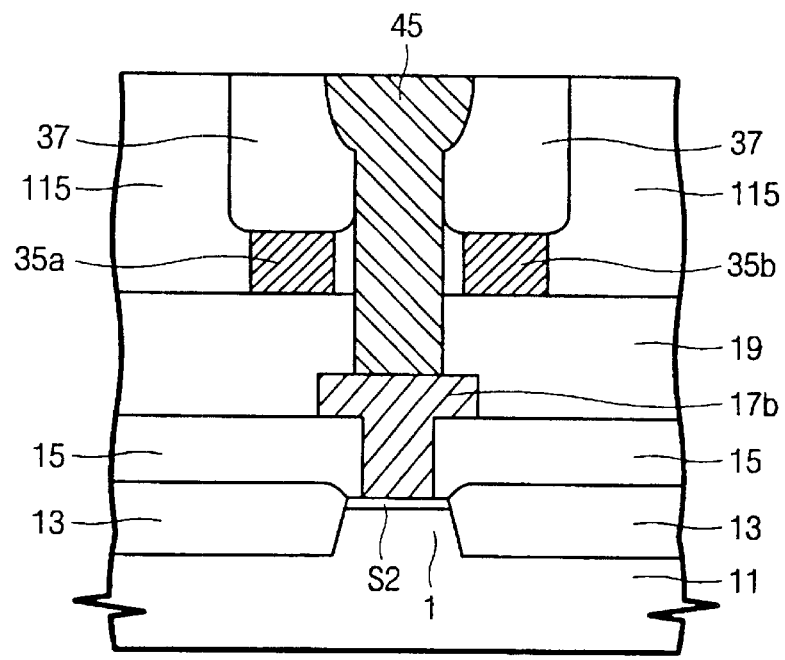

Referring to FIGS. 5F and 5G, a photoresist pattern 41 is formed on the sacrificial layer 39. The photoresist pattern 41 exposes a predetermined portion of the sacrificial layer 39. The exposed predetermined portion of the sacrificial layer 39, the second interlayer insulating layer 115 and the first interlayer insulating layer 19 are sequentially etched using the photoresist pattern 41 as an etch mask, thereby forming a self-aligned contact hole penetrating a region between the adjacent mask patterns 37 and exposing the conductive pad 17b. The mask patterns 37 act as etch stoppers during this etching process. A conductive layer filling the self-aligned contact hole is then formed on the entire surface of the resultant structure having the self-aligned contact hole. The conductive layer may be formed of a polysilicon layer.

The conductive layer is planarized using a CMP technique until the mask patterns 37 are exposed. The mask patterns 37 act as CMP stoppers. As a result, a conductive layer pattern 45 is formed in the self-aligned contact hole. The conductive layer pattern 45 may correspond to a storage node plug of a DRAM.

FIGS. 6A–6F are cross-sectional views illustrating a method of forming a self-aligned contact structure according to yet another embodiment of the present invention. The cross-sectional views of FIGS. 6A–6F are taken along the line I—I of FIG. 1.

Figure 6A:
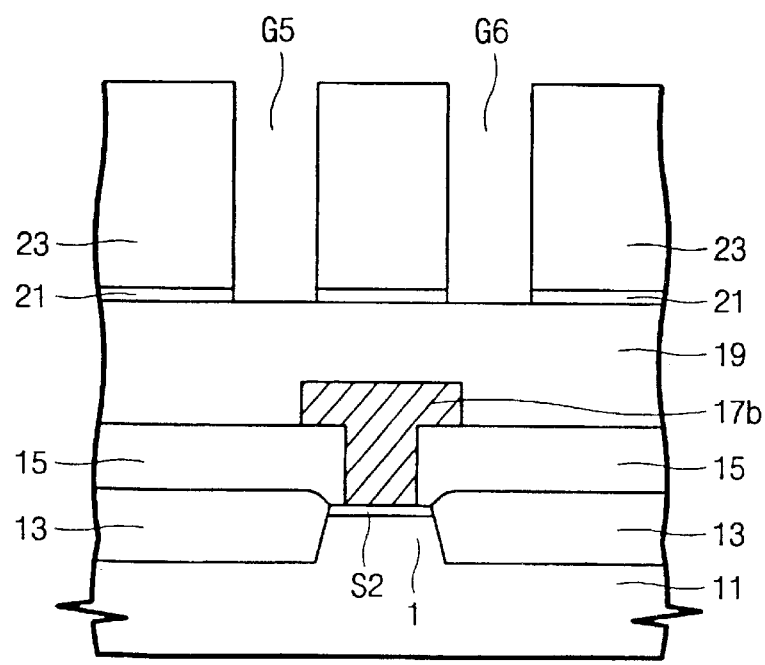
FIGS. 6A–6F are cross-sectional views along line I—I of FIG. 1 illustrating. a method of forming a self-aligned contact structure according to yet another embodiment of the present invention.

Referring now to FIG. 6A, the planarized insulating layer 15, the conductive pad 17b (second storage node pad) and the first interlayer insulating layer 19 can be formed using the same manner as the embodiment of the present invention described above with reference to FIGS. 3A–3G. An etch stop layer 21 and a second interlayer insulating layer 23 are sequentially formed on the first interlayer insulating layer 19. The etch stop layer 21 is preferably formed of an insulating layer having an etch selectivity with respect to the first and second interlayer insulating layers 19 and 23. For example, the etch stop layer 21 is preferably formed of a silicon nitride layer. The second interlayer insulating layer 23 and the etch stop layer 21 are sequentially patterned to form a pair of parallel interconnection grooves G5 and G6.

Figure 6B:
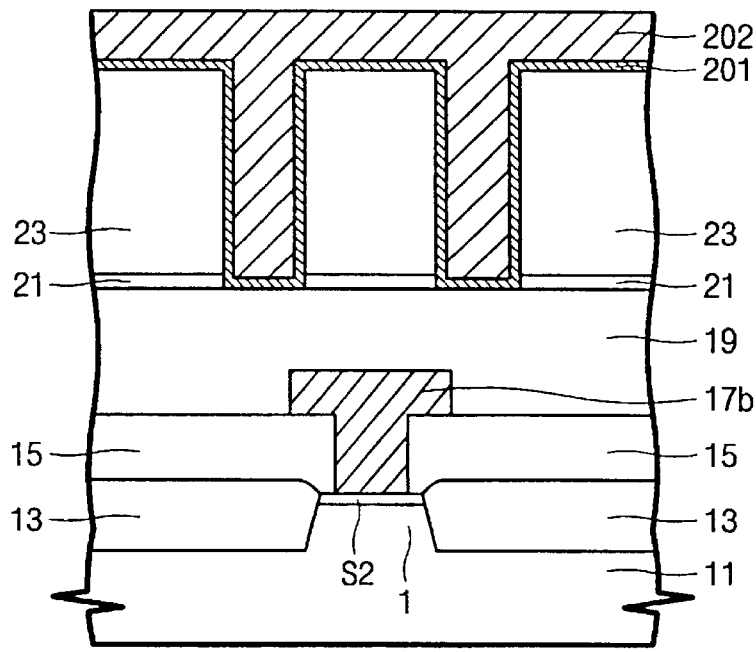

Referring to FIG. 6B, a barrier metal layer 201 and an interconnection metal layer 202 are sequentially formed on the resultant structure including the interconnection grooves G5 and G6. The barrier metal layer 201 and the interconnection metal layer 202 constitute an interconnection layer. The barrier metal layer 201 is preferably formed of a titanium nitride. (TiN) layer or a tantalum nitride (TaN) layer, and the interconnection metal layer 202 is preferably formed of a tungsten (W) layer.

Figure 6C:
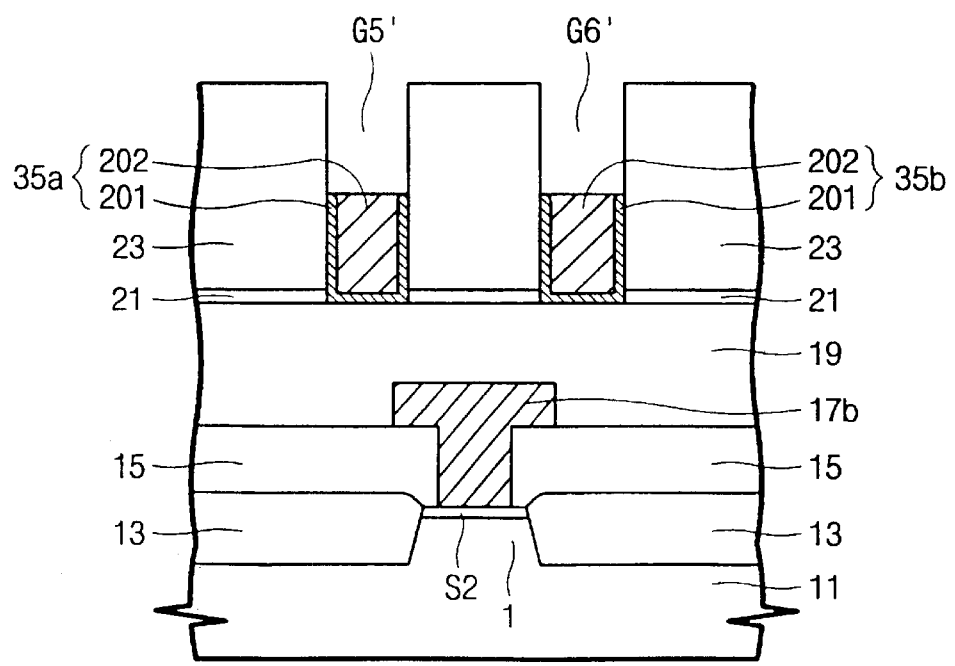

Referring to FIG. 6C, the interconnection metal layer 202 and the barrier metal layer 201 are over-etched until the top surface of the second interlayer insulating layer 23 and the upper sidewalls of the interconnection grooves G5' and G6' are exposed. Accordingly, first and second interconnections 35a and 35b are formed in the lower portions of the interconnection grooves G5 and G6, respectively, and recessed regions G5' and G6' are formed on the interconnections 35a and 35b, respectively. The first and second interconnections 35a and 35b comprise a first interconnection metal layer pattern 202 and a first barrier metal layer pattern 201 surrounding the sidewall and bottom of the first interconnection metal layer pattern 202.

Figure 6D:
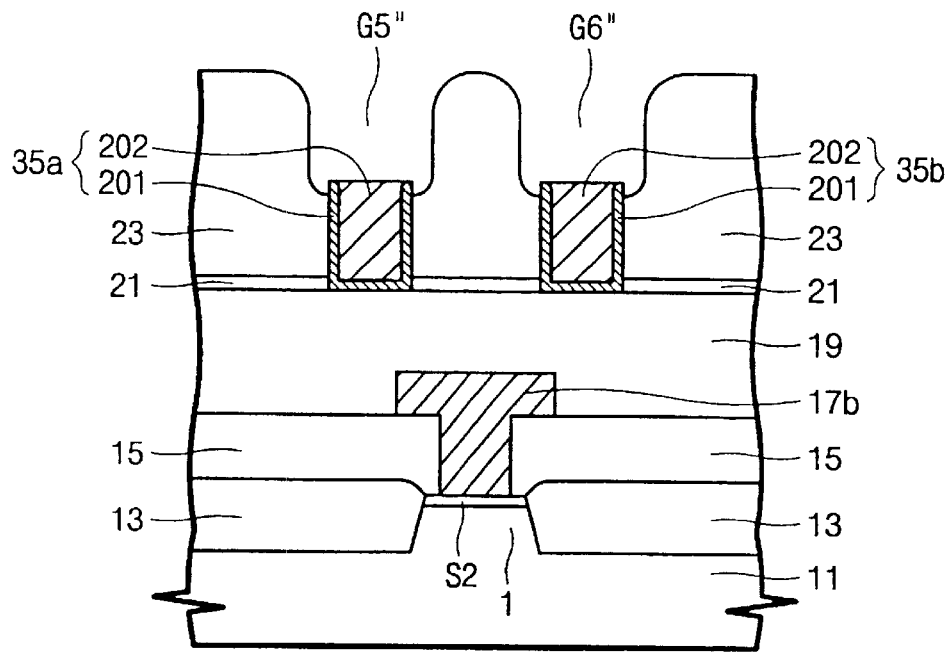

Referring to FIG. 6D, the second interlayer insulating layer 23 is isotropically etched using a wet etchant such as a hydrofluoric acid (HF) or a buffered oxide etchant (BOE), thereby forming enlarged recessed regions GC" and G6". Alternatively, the second interlayer insulating layer 23 may be isotropically etched using a dry etching process.

Therefore, each of the enlarged recessed regions G5" and G6" has a width that is wider than the width of the interconnection thereunder and has a vertical sidewall profile, as shown in FIG. 6D.

Figure 6E:
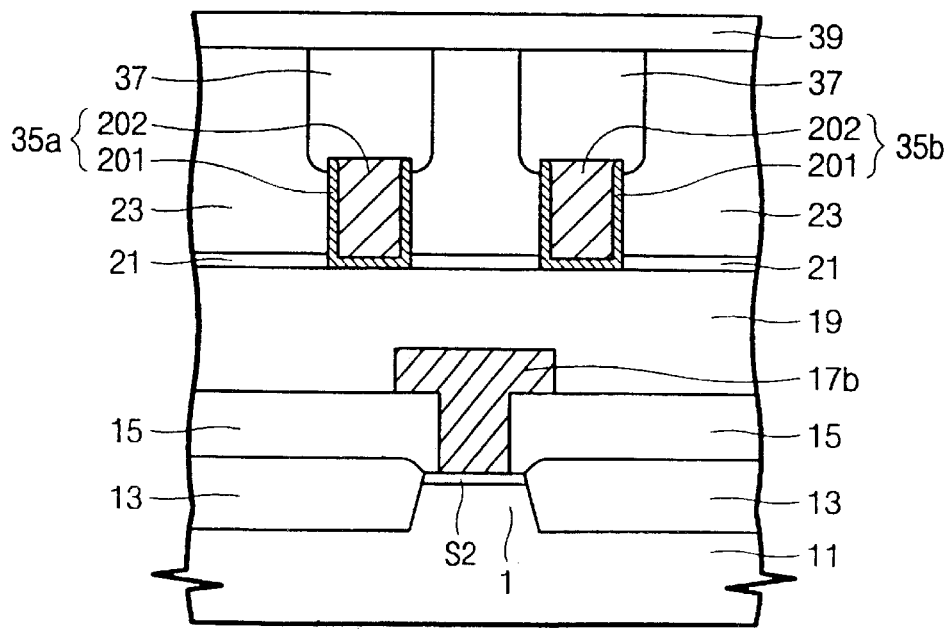
Figure 6F:
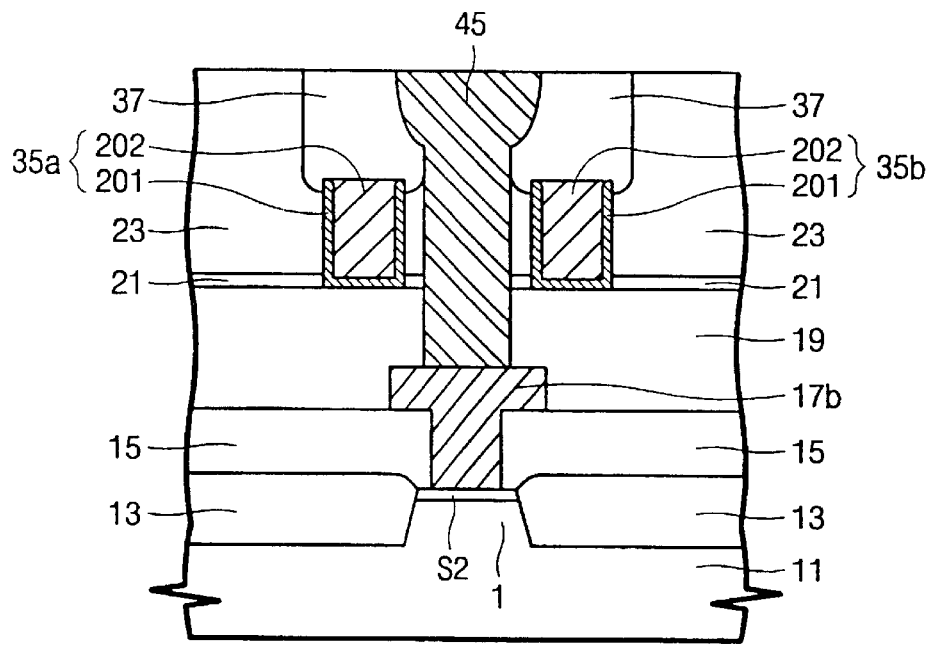

Referring to FIGS. 6E and 6F, mask patterns 37, a sacrificial layer 39 and a conductive layer pattern 45 are formed in the same manner as in the embodiment of the present invention described above with reference to FIGS. 5E–5G.

Figure 7A:
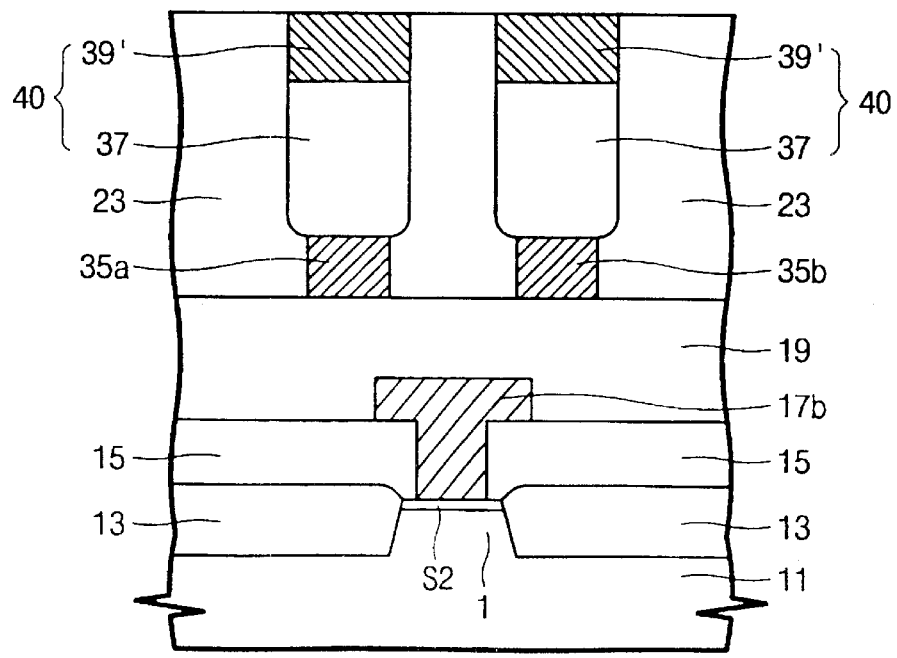
FIGS. 7A–7C are cross-sectional views along line I—I of FIG. 1 illustrating a method of forming a self-aligned contact structure according to still yet another embodiment of the present invention.
Figure 7B:
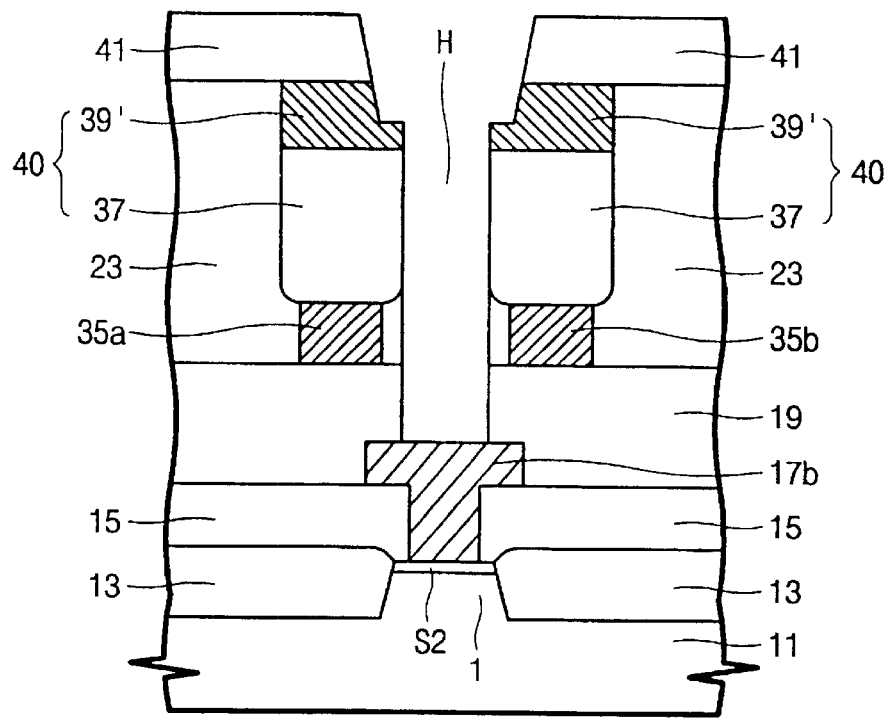
Figure 7C:
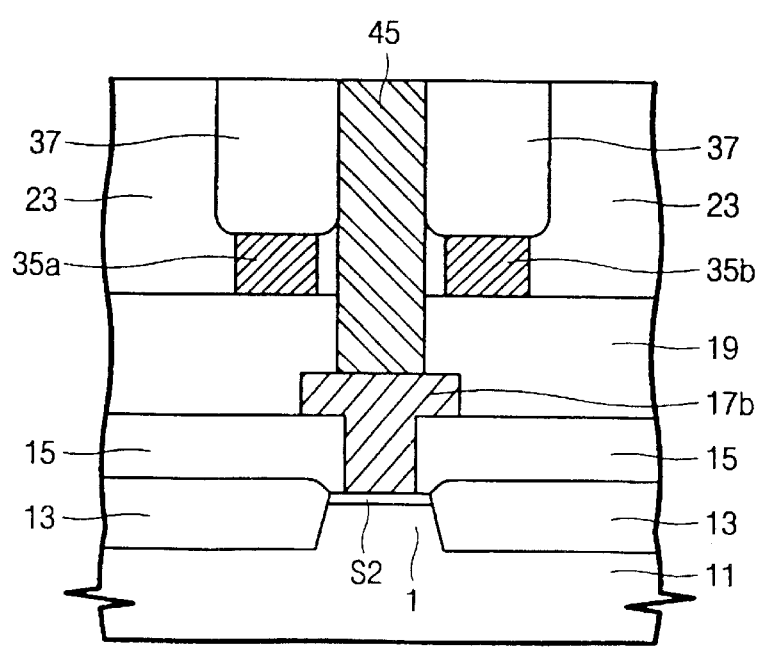

FIGS. 7A–7C are cross-sectional views illustrating a method of forming a self-aligned contact structure according to still yet another embodiment of the present invention. A significant feature of this embodiment lies in the use of a double-layered mask pattern. The cross-sectional views of FIGS. 7A–7C are taken along the line I—I of FIG. 1.

Referring now to FIG. 7A, the planarized insulating layer 15, the conductive pad 17b (second storage node pad), the first interlayer insulating layer 19, the first and second interconnections 35a and 35b, and the second interlayer insulating layer 23 having the enlarged recessed regions 37 can be formed using the same manner as the embodiment of the present invention described above with reference to FIGS. 5A–5D. A first mask layer is formed on the entire surface of the resultant structure where the enlarged recessed regions 37 are formed. The first mask layer is preferably formed of a silicon nitride layer. The first mask layer is etched back to form first mask patterns 37 on the interconnections 35a and 35b and to simultaneously expose the top surface of the second interlayer insulating layer 23 and the upper sidewalls of the enlarged recessed regions 37. As a result, the upper portions of the enlarged recessed regions 37 are empty.

Subsequently, a second mask layer is formed on the entire surface of the resultant structure where the first mask patterns 37 are formed. It is preferable that the entire enlarged recessed regions 37 are completely filled with the second mask layer. The second mask layer is preferably formed of a material layer having a high etch selectivity with respect to the first and second interlayer insulating layers 19 and 23. For example, the second mask layer may be formed of a polysilicon layer. The second mask layer is then etched back until the top surface of the second interlayer insulating layer 23 is exposed, thereby forming second mask patterns 39' on the first mask patterns 37. The first mask pattern 37 and the second mask pattern 39' thereon constitute a mask pattern 40.

Referring to FIG. 7B, a photoresist pattern 41 is formed on the resultant structure where the second mask patterns 39' are formed. The photoresist pattern 41 exposes a predetermined region of the second interlayer insulating layer 23 between the adjacent second mask patterns 39'. The exposed second interlayer insulating layer 23 and the first interlayer insulating layer 19 are sequentially etched using the photoresist pattern 41 as an etch mask, thereby forming a self-aligned contact hole H exposing the conductive pad 17b. The mask patterns 40 (in particular, the second mask patterns 39') act as etch stoppers. Thus, it can prevent the first mask patterns 37 from being damaged during the etch process for forming the self-aligned contact hole H.

Referring to FIG. 7C, after removing the photoresist pattern 41, a conductive layer such as a polysilicon layer is formed on the resultant structure having the self-aligned contact hole H. It is preferable that the self-aligned contact hole H is completely filled with the conductive layer. The conductive layer and the second mask patterns 39' are then planarized using a CMP technique until the first mask patterns 37 are exposed. Thus, a conductive layer pattern 45, i.e., a storage node plug is formed in the self-aligned contact hole H.

As described above, according to various embodiments of the present invention, an insulating layer having a relatively low dielectric constant is interposed between the conductive layer and the interconnections at both sides of the conductive layer. This reduces the parasitic capacitance between the conductive layer and the interconnections and it improves the operating speed of the semiconductor device. Also, it is easy to pattern the interconnections by forming the interconnections using the damascene process. Therefore, even though the interconnections are comprised of a metal layer, bridges are not left between the adjacent interconnections when the method of the invention is carried out.

While the invention has been described in detail with reference to particularly preferred embodiments, those skilled in the art will appreciate that various modifications may be made to the invention without departing from the spirit and scope thereof.

What is claimed is:

1. A self-aligned contact structure in a semiconductor device, comprising:

a semiconductor substrate having active regions;

an interlayer insulating layer covering the semiconductor substrate excluding at least a portion of each active region;

at least two parallel interconnections on the interlayer insulating layer, at least one active region being relatively disposed between the at least two parallel interconnections, each interconnection having sidewalls, a bottom and a width (x);

a mask pattern having a top portion of width (z) and a bottom portion of width (y) formed on each interconnection; and a conductive layer pattern penetrating at least a portion of the interlayer insulating layer between the mask pattern and being electrically connected to at least one active region, wherein $x \leq y \leq z$ and $x < z$.

2. The self-aligned contact structure in a semiconductor device as claimed in claim 1, wherein each active region comprises a conductive pad.

3. The self-aligned contact structure in a semiconductor device as claimed in claim 2, further comprising a seconds interlayer insulating layer above the interlayer insulating layer covering the semiconductor substrate, wherein the second interlayer insulating layer has a dielectric constant that is lower than the dielectric constant of the mask pattern.

4. The self-aligned contact structure in a semiconductor device as claimed in claim 1, wherein each of the at least two parallel interconnections comprises a barrier metal layer and an interconnection metal that are sequentially stacked.

5. The self-aligned contact structure in a semiconductor device as claimed in claim 1, wherein each of the at least two parallel interconnections comprises an interconnection metal layer having a bottom and sidewalls and a barrier metal layer surrounding the bottom and sidewalls of the interconnection metal layer.

6. The self-aligned contact structure in a semiconductor device as claimed in claim 1, wherein the mask pattern comprises:

- an etch stop layer pattern having sidewalls formed on the interconnection; and
- a first spacer having inner and outer sidewalls formed on the sidewalls of the etch stop layer pattern, the outer sidewall of the first spacer having a vertical profile that is perpendicular to the top surface of the semiconductor substrate.

7. The self-aligned contact structure in a semiconductor device as claimed in claim 6, further comprising a second spacer interposed between the conductive layer pattern and the first spacer.

8. A self-aligned contact structure as claimed in claim 1, wherein the mask pattern comprises an etch stop pattern having a vertical sidewall profile that is perpendicular to the top surface of the semiconductor substrate.

9. A self-aligned contact structure as claimed in claim 1, wherein the interlayer insulating layer is comprised of silicon oxide.

* * * * *